United States Patent
Schulz et al.

(10) Patent No.: US 8,188,551 B2
(45) Date of Patent: May 29, 2012

(54) SEMICONDUCTOR DEVICES AND METHODS OF MANUFACTURE THEREOF

(75) Inventors: Thomas Schulz, Austin, TX (US); Hongfa Luan, Austin, TX (US)

(73) Assignee: Infineon Technologies AG, Munich (DE)

( * ) Notice: Subject to any disclaimer, the term of this patent is extended or adjusted under 35 U.S.C. 154(b) by 804 days.

(21) Appl. No.: 11/240,698

(22) Filed: Sep. 30, 2005

(65) Prior Publication Data

US 2007/0075351 A1 Apr. 5, 2007

(51) Int. Cl.
*H01L 29/76* (2006.01)

(52) U.S. Cl. .................. 257/401; 257/E29.275

(58) Field of Classification Search ............. 257/401, 257/E21.442, E42.635, E29.275
See application file for complete search history.

(56) References Cited

U.S. PATENT DOCUMENTS

| | | |
|---|---|---|
| 4,432,035 A | 2/1984 | Hsieh et al. |
| 4,990,974 A | 2/1991 | Vinal |
| 5,041,885 A | 8/1991 | Gualandris et al. |
| 5,066,995 A | 11/1991 | Young et al. |
| 5,162,263 A | 11/1992 | Kunishima et al. |
| 5,321,287 A | 6/1994 | Uemura et al. |
| 5,352,631 A | 10/1994 | Sitaram et al. |
| 5,763,922 A | 6/1998 | Chau |
| 5,994,747 A | 11/1999 | Wu |
| 6,020,243 A | 2/2000 | Wallace et al. |
| 6,027,961 A | 2/2000 | Maiti et al. |
| 6,033,944 A | 3/2000 | Shida |
| 6,048,769 A | 4/2000 | Chau |
| 6,084,280 A | 7/2000 | Gardner et al. |
| 6,124,171 A | 9/2000 | Arghavani et al. |
| 6,159,782 A | 12/2000 | Xiang et al. |
| 6,171,910 B1 | 1/2001 | Hobbs et al. |
| 6,184,072 B1 | 2/2001 | Kaushik et al. |
| 6,225,163 B1 | 5/2001 | Bergemont |
| 6,291,867 B1 | 9/2001 | Wallace et al. |
| 6,348,390 B1 | 2/2002 | Wu |
| 6,373,111 B1 | 4/2002 | Zheng et al. |
| 6,410,967 B1 | 6/2002 | Hause et al. |

(Continued)

FOREIGN PATENT DOCUMENTS

EP 1 298 722 A2 4/2003

(Continued)

OTHER PUBLICATIONS

Li, H.-J., et al., "Dual High-*K* Gate Dielectric with Poly Gate Electrode: HfSiON on nMOS $Al_2O_3$ Capping Layer on pMOS," IEEE Electron Device Letters, vol. 26, No. 7, Jul. 2005, pp. 441-444.

(Continued)

*Primary Examiner* — Colleen Matthews
(74) *Attorney, Agent, or Firm* — Slater & Matsil, L.L.P.

(57) ABSTRACT

Semiconductor devices and methods of manufacture thereof are disclosed. A complimentary metal oxide semiconductor (CMOS) device includes a PMOS transistor having at least two first gate electrodes comprising a first parameter, and an NMOS transistor having at least two second gate electrodes comprising a second parameter, wherein the second parameter is different than the first parameter. The first parameter and the second parameter may comprise the thickness or the dopant profile of the gate electrode materials of the PMOS and NMOS transistors. The first and second parameter of the at least two first gate electrodes and the at least two second gate electrodes establish the work function of the PMOS and NMOS transistors, respectively.

20 Claims, 13 Drawing Sheets

U.S. PATENT DOCUMENTS

| | | |
|---|---|---|
| 6,432,776 B1 | 8/2002 | Ono |
| 6,444,555 B2 | 9/2002 | Ibok |
| 6,448,127 B1 | 9/2002 | Xiang et al. |
| 6,475,908 B1 | 11/2002 | Lin et al. |
| 6,492,217 B1 | 12/2002 | Bai et al. |
| 6,528,858 B1 | 3/2003 | Yu et al. |
| 6,563,183 B1 | 5/2003 | En et al. |
| 6,656,764 B1 | 12/2003 | Wang et al. |
| 6,693,333 B1 | 2/2004 | Yu |
| 6,716,685 B2 | 4/2004 | Lahaug |
| 6,720,221 B1 | 4/2004 | Ahn et al. |
| 6,737,313 B1 | 5/2004 | Marsh et al. |
| 6,740,944 B1 | 5/2004 | McElheny et al. |
| 6,852,645 B2 | 2/2005 | Colombo et al. |
| 6,855,605 B2 | 2/2005 | Jurczak et al. |
| 6,897,095 B1 | 5/2005 | Adetutu et al. |
| 6,921,691 B1 | 7/2005 | Li et al. |
| 6,936,882 B1* | 8/2005 | Ahmed et al. ............. 257/314 |
| 7,060,568 B2 | 6/2006 | Metz et al. |
| 7,091,568 B2 | 8/2006 | Hegde et al. |
| 7,348,284 B2* | 3/2008 | Doyle et al. .......... 257/E29.193 |
| 7,361,958 B2* | 4/2008 | Brask et al. ............... 257/369 |
| 2001/0012653 A1 | 8/2001 | Tsukamoto |
| 2002/0005556 A1 | 1/2002 | Cartier et al. |
| 2002/0053711 A1 | 5/2002 | Chau et al. |
| 2002/0090773 A1 | 7/2002 | Bojarczuk, Jr. et al. |
| 2002/0098649 A1 | 7/2002 | Chien et al. |
| 2002/0135030 A1 | 9/2002 | Horikawa |
| 2002/0135048 A1 | 9/2002 | Ahn et al. |
| 2002/0151125 A1 | 10/2002 | Kim et al. |
| 2002/0153573 A1 | 10/2002 | Mogami |
| 2003/0057432 A1 | 3/2003 | Gardner et al. |
| 2003/0099766 A1 | 5/2003 | Jurczak et al. |
| 2003/0104663 A1 | 6/2003 | Visokay et al. |
| 2003/0116804 A1 | 6/2003 | Visokay et al. |
| 2003/0119292 A1 | 6/2003 | Lee et al. |
| 2003/0137017 A1 | 7/2003 | Hisamoto et al. |
| 2003/0141560 A1 | 7/2003 | Sun |
| 2003/0151074 A1 | 8/2003 | Zheng et al. |
| 2003/0203501 A1 | 10/2003 | Ryu et al. |
| 2003/0219953 A1 | 11/2003 | Mayuzumi |
| 2004/0000695 A1 | 1/2004 | Matsuo |
| 2004/0005749 A1 | 1/2004 | Choi et al. |
| 2004/0009675 A1 | 1/2004 | Eissa et al. |
| 2004/0023462 A1 | 2/2004 | Rotondaro et al. |
| 2004/0106249 A1 | 6/2004 | Huotari |
| 2004/0113211 A1 | 6/2004 | Hung et al. |
| 2004/0132271 A1 | 7/2004 | Ang et al. |
| 2004/0137703 A1 | 7/2004 | Gao et al. |
| 2004/0171222 A1 | 9/2004 | Gao et al. |
| 2004/0180487 A1 | 9/2004 | Eppich et al. |
| 2004/0217429 A1 | 11/2004 | Lin et al. |
| 2004/0242021 A1 | 12/2004 | Kraus et al. |
| 2005/0035345 A1 | 2/2005 | Lin et al. |
| 2005/0064663 A1 | 3/2005 | Saito |
| 2005/0098839 A1 | 5/2005 | Lee et al. |
| 2005/0101159 A1 | 5/2005 | Droopad |
| 2005/0139926 A1 | 6/2005 | Shimizu et al. |
| 2005/0148131 A1 | 7/2005 | Brask |
| 2005/0224897 A1 | 10/2005 | Chen et al. |
| 2005/0245019 A1 | 11/2005 | Luo et al. |
| 2005/0280104 A1 | 12/2005 | Li |
| 2006/0003507 A1 | 1/2006 | Jung et al. |
| 2006/0017112 A1 | 1/2006 | Wang et al. |
| 2006/0038236 A1 | 2/2006 | Yamamoto |
| 2006/0118879 A1 | 6/2006 | Li |
| 2006/0125018 A1 | 6/2006 | Lee et al. |
| 2006/0131652 A1 | 6/2006 | Li |
| 2006/0141729 A1 | 6/2006 | Wang et al. |
| 2006/0211195 A1 | 9/2006 | Luan |
| 2006/0223335 A1 | 10/2006 | Mathew et al. |
| 2006/0275975 A1 | 12/2006 | Yeh et al. |
| 2006/0292773 A1 | 12/2006 | Goolsby et al. |
| 2007/0018245 A1 | 1/2007 | Jeng |
| 2007/0020903 A1 | 1/2007 | Takehara et al. |
| 2007/0034945 A1 | 2/2007 | Bohr et al. |

FOREIGN PATENT DOCUMENTS

| | | |
|---|---|---|
| EP | 1 315 200 A1 | 5/2003 |
| EP | 1 388 889 A2 | 2/2004 |
| EP | 1 531 496 A2 | 5/2005 |
| EP | 1 538 674 A2 | 6/2005 |
| JP | 10-335480 | 12/1998 |
| JP | 2000-031296 | 1/2000 |
| JP | 2000-058668 | 2/2000 |
| JP | 2000-243853 | 9/2000 |
| JP | 2002118175 | 4/2002 |
| JP | 2003-273350 | 9/2003 |
| JP | 2004-221596 | 8/2004 |
| JP | 2004-260165 | 9/2004 |
| JP | 2004289061 | 10/2004 |
| JP | 2004-356472 | 12/2004 |
| JP | 2005-268553 | 9/2005 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

"Front End Processes," The International Technology Roadmap for Semiconductors: 2003 Edition, pp. 23-25, http://member.itrs.net/.

Gannavaram, S., et al., "Low Temperature ($\leqq$ 800° C) Recessed Junction Selective Silicon-Germanium Source/Drain Technology for sub-70 nm CMOS," 2000, 4 pp., IEEE, Los Alamitos, CA.

Guha, S., et al., "Atomic Beam Deposition of Lanthanum- and Yttrium-Based Oxide Thin Films for Gate Dielectrics," Applied Physics Letters, Oct. 23, 2000, pp. 2710-2712, vol. 77, No. 17, American Institute of Physics, Melville, NY.

"High $_K$ Dielectric Materials," Tutorial: Materials for Thin Films / Microelectronics, http://www.sigmaaldrich.com/Area_of_Inorganic_Chemistry/Materials_Science/Thin_Films_Microelectronics/Tutorial/Dielectric_Materials.html, downloaded Jun. 9, 2004, 3 pp., Sigma-Aldrich Co., St. Louis, MO.

Hobbs, C., et al., "Fermi Level Pinning at the PolySi/Metal Oxide Interface," 2003 Symposium on VLSI Technology Digest of Technical Papers, Jun. 2003, 2 pp., IEEE, Los Alamitos, CA.

Huang, F.-J., et al., "Schottky-Clamped NMOS Transistors Implemented in a Conventional 0.8-μm CMOS Process," IEEE Electron Device Letters, Sep. 1998, pp. 326-328, vol. 19, No. 9, IEEE, Los Alamitos, CA.

Muller, R.S., et al., "Device Electronics for Integrated Circuits," Second Ed., 1986, pp. 380-385, 398-399, John Wiley & Sons, New York, NY.

Park, D.-G., et al., "Thermally Robust Dual-Work Function ALD-$MN_x$ MOSFETs using Conventional CMOS Process Flow," 2004 Symposium on VLSI Technology Digest of Technical Papers, 2004, pp. 186-187, IEEE, Los Alamitos, CA.

Samavedam, S.B., et al., "Fermi Level Pinning with Sub-Monolayer MeOx and Metal Gates," Mar. 2003, 4 pp., IEEE, Los Alamitos, CA.

Wolf, S., "Silicon Processing for the VLSI Era: vol. II—CMOS Process Integration," 1990, pp. 432-441, Lattice Press, Sunset Beach, CA.

Wakabayashi, H., et al., "A Dual-Metal Gate CMOS Technology Using Nitrogen-Concentration-Controlled TiNx Film," IEEE Transactions on Electron Devices, Oct. 2001, pp. 2363-2369, vol. 48, No. 10, IEEE, Los Alamitos, CA.

Chang, L., et al., "Extremely Scaled Silicon Nano-CMOS Devices," Proceedings of the IEEE, Nov. 2003, vol. 91, No. 11, pp. 1860-1873, IEEE.

Choi, Y-K., et al., "FinFET Process Refinements for Improved Mobility and Gate Work Function Engineering," IEDM, 2002, pp. 259-262, IEEE.

Choi, Y-K, et al., "Sub-20nm CMOS FinFET Technologies," IEDM, 2001, pp. 421-424, IEEE.

"Front End Processes," The International Technology Roadmap for Semiconductors, 2002 Update, pp. 45-62, http://member.itrs.net/.

Lin, R., et al., "An Adjustable Work Function Technology Using Mo Gate for CMOS Devices," IEEE Electron Device Letters, Jan. 2002, pp. 49-51, vol. 23, No. 1, IEEE.

Nowak, E.J., et al., "Turning Silicon on its Edge: Overcoming Silicon Scaling Barriers with Double-Gate and FinFET Technology," IEEE Circuits & Devices Magazine, Jan./Feb. 2004, pp. 20-31, IEEE.

Yu, B., et al., "FinFET Scaling to 10nm Gate Length," IEDM, 2002, pp. 251-254, IEEE.

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

Ha, D., et al., "Molybdenum-Gate $HfO_2$ CMOS FinFET Technology," IEEE, 2004, 4 pages.

Kedzierski, J., et al., "Fabrication of Metal Gated FinFETs Through Complete Gate Silicidation With Ni," IEEE Transactions on Electron Devices, vol. 51, No. 12, Dec. 2004, pp. 2115-2120.

Kedzierski, J., et al., "Metal-gate FinFET and fully-depleted SOI devices using total gate silicidation," IEEE, 2002, pp. 247-250.

Gao, W., et al., "Stacked Metal Layers as Gates for MOSFET Threshold Voltage Control," Materials Research Society Symposium, 2003, pp. 3-8, vol. 765.

Li, T-L., et al., "Continuous and Precise Work Function Adjustment for Integratable Dual Metal Gate CMOS Technology Using Hf-Mo Binary Alloys," IEEE Transactions on Electron Devices, Jun. 2005, pp. 1172-1179, vol. 52, No. 6.

Polishchuk, I., et al., "Dual Work Function Metal Gate CMOS Transistors Fabricated by Ni-Ti Interdiffusion," IEEE Electron Device Letters, Apr. 2002, pp. 411-414, vol. 23, Issue 4.

Samavedam, S.B. et al., "Dual-Metal Gate CMOS with $HfO_2$ Gate Dielectric," Electron Devices Meeting, IEEE, 2002, pp. 433-436.

Aoyama, T., et al., "Proposal of New HfSiON CMOS Fabrication Process (HAMDAMA) for Low Standby Power Device," IEDM Technical Digest, Dec. 2004, pp. 95-98.

Yeo, Y-C., et at., "Dual-Metal Gate CMOS Technology with Ultrathin Silicon Nitride Gate Dielectric," IEEE Electron Device Letters, May 2001, pp. 227-229, vol. 22, Issue 5.

Polishchuk, I., et al., "Polycrystalline Silicon/Metal Stacked Gate for Threshold Voltage Control in Metal-Oxide-Semiconductor Field-Effect Transistors," Applied Physics Letters, Apr. 3, 2000, pp. 1938-1940, vol. 76, No. 14, 2000 American Institute of Physics.

Samavedam, S.B., et al., "Evaluation of Candidate Metals for Dual-Metal Gate CMOS with $HfO_2$ Gate Dielectric," Materials Research Society Symposium, 2002, pp. 85-90, vol. 716, Materials Research Society.

Wolf, S., et al., "Silicon Processing for the VLSI Era: vol. I—Process Technology," pp. 388 and 526, Second Edition, Lattice Press, Sunset Beach, CA.

* cited by examiner

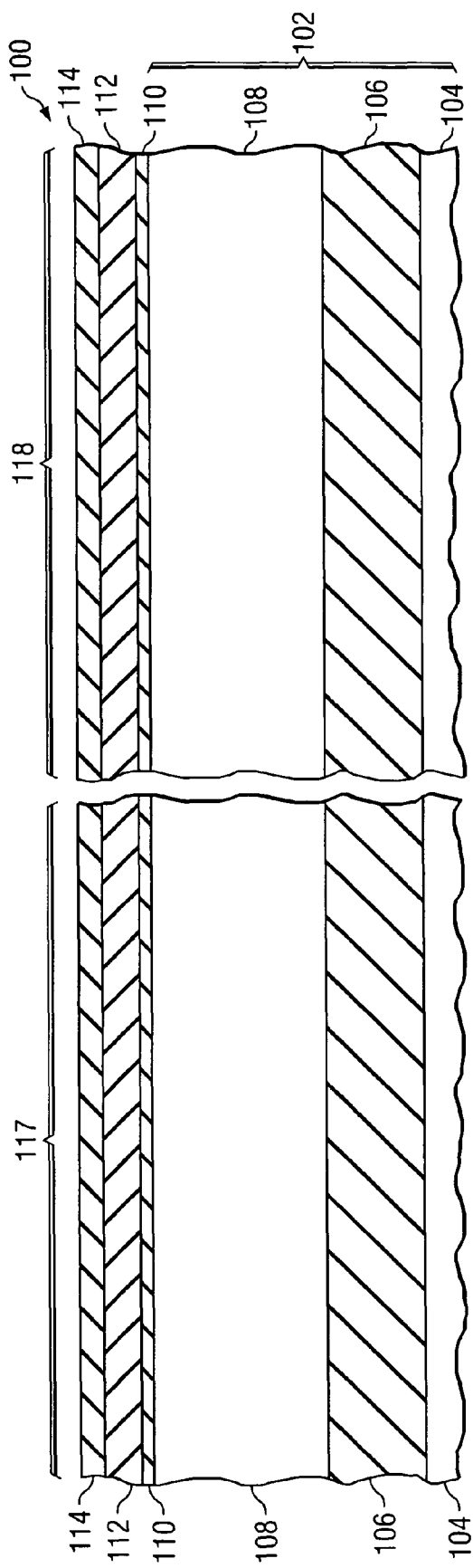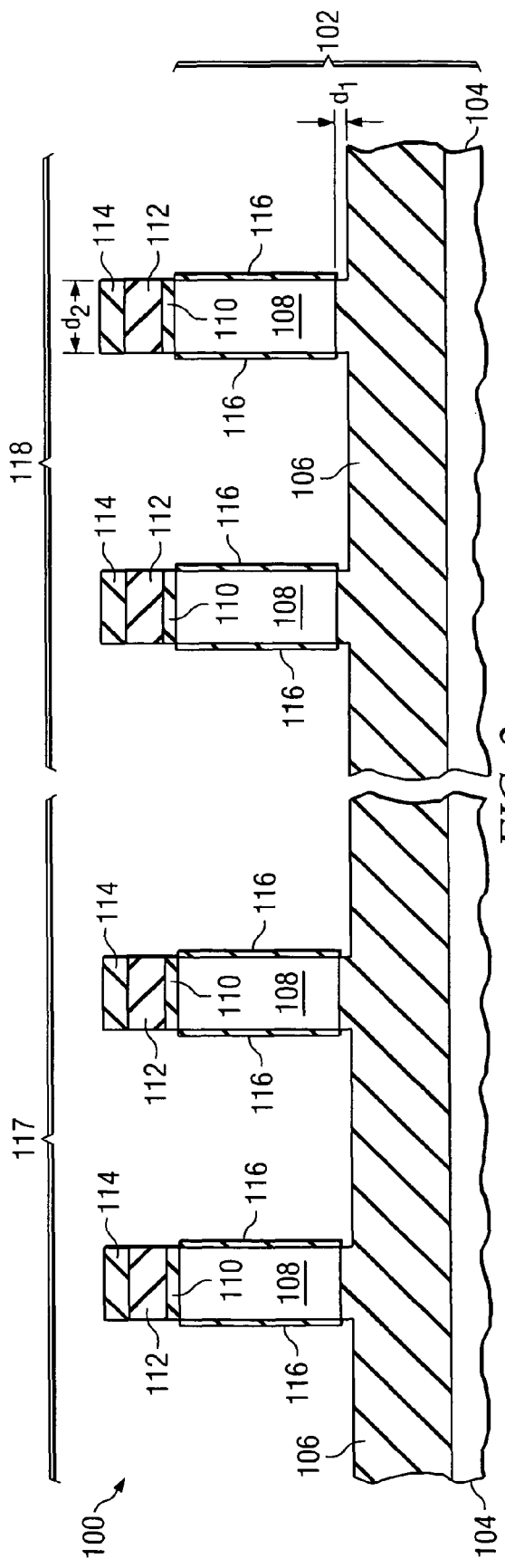
FIG. 1
FIG. 2

SEMICONDUCTOR DEVICES AND METHODS OF MANUFACTURE THEREOF

TECHNICAL FIELD

The present invention relates generally to semiconductor devices, and more particularly to transistors having multiple gates and methods of manufacture thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). Conventional MOSFETs have one gate electrode that controls a channel region, and are often referred to as single gate transistors. Early MOSFET processes used one type of doping to create single transistors that comprised either positive or negative channel transistors. Other more recent designs, referred to as complementary MOS (CMOS) devices, use both positive and negative channel devices, e.g., a positive channel metal oxide semiconductor (PMOS) transistor and a negative channel metal oxide semiconductor (NMOS) transistor, in complementary configurations.

Conventional bulk single-gate planar MOSFET devices cannot achieve the requested performance for future technology nodes of 45 nm or beyond. The classic bulk device concept is based on a complex three-dimensional doping profile, which includes channel implantation, source and drain region implantation, lightly doped drain (LDD) extension implantation, and pocket/halo implantation processes, which are not further scalable down in size, because of an increase in dopant fluctuations and stronger parasitic short channel effects, due to lack of potential control in the channel region and the deep substrate. Therefore, the ITRS Roadmap, e.g., disclosed in the 2002 edition of International Technology Roadmap for Semiconductors (ITRS), which is incorporated herein by reference, has proposed two novel design concepts: a fully depleted planar silicon-on-insulator (SOI) MOSFET device, and a vertical multiple-gate FinFET (fin field effect transistor) or Tri-Gate device.

Thus, transistors with multiple gates are an emerging transistor technology. A double gate transistor has two parallel gates that face each other and control the same channel region. A FinFET is a vertical double gate device, wherein the channel comprises a vertical fin comprising semiconductor material, typically formed on a silicon-on-insulator (SOI) substrate. The two gates of a FinFET are formed on opposing sidewalls of the vertical fin. A tri-gate transistor has three gates that control the same channel region, e.g., the channel comprises the vertical fin, two of the gates are formed on the sides of the vertical fin, and a third gate is formed on the top of the fin. A FinFET structure is similar to a tri-gate transistor, with the third gate being blocked by an insulating material or hard mask disposed on top of the fin. FinFETs and tri-gate transistors, and some of the manufacturing challenges of forming them, are described in a paper entitled, "Turning Silicon on its Edge: Overcoming Silicon Scaling Barriers with Double-Gate and FinFET Technology," by Nowak, E. J., et al., in IEEE Circuits & Devices Magazine, January/February 2004, pp. 20-31, IEEE, which is incorporated herein by reference.

FinFETs and Tri-Gate transistors may be used to form CMOS devices. One or more FinFETs can be used as a PMOS and/or NMOS transistor: often, two or more fins in parallel are used to form a single PMOS or NMOS transistor. FinFETs can be scaled more aggressively than planar transistor structures, and show lower gate-induced drain leakage (GIDL) current, as described in a paper entitled, "Extremely Scaled Silicon Nano-CMOS Devices," by Chang, L., et al., in Proceedings of the IEEE, November 2003, Vol. 91, No. 11, pp. 1860-1873, IEEE, which is incorporated herein by reference. However, multiple gate transistors such as FinFETs are more difficult and complicated to manufacture than planar CMOS devices, and they require distinctly different materials and introduce a variety of processing challenges.

Furthermore, it is important to design CMOS devices so that a symmetric threshold voltage $V_t$ for the NMOS and PMOS transistors of the CMOS device is achieved. However, it is difficult to find materials, device structures, and manufacturing processes that will achieve a symmetric threshold voltage $V_t$, as devices are made smaller, and particularly for advanced transistor designs having multiple gates.

Thus, what are needed in the art are improved structures and manufacturing processes for multiple gate transistors.

SUMMARY OF THE INVENTION

These and other problems are generally solved or circumvented, and technical advantages are generally achieved, by preferred embodiments of the present invention, which comprise novel structures and methods of forming gate electrodes of multiple gate transistors. A first parameter and a second parameter of the gate electrode materials for a PMOS and NMOS device are adjusted to tune the work function of the gate electrode materials. In some embodiments, metals are used as gate electrode materials that have a tunable or adjustable work function by varying the thickness of the gate material, and the metal thickness is adjusted for PMOS and NMOS multiple gate transistors to achieve the desired work function. In other embodiments, the gate material is implanted with a dopant species to achieve the desired work function.

In accordance with a preferred embodiment of the present invention, a semiconductor device includes a first transistor, the first transistor including at least two first gate electrodes, and the at least two first gate electrodes having a first parameter. The semiconductor device includes a second transistor proximate the first transistor, the second transistor including at least two second gate electrodes. The at least two second gate electrodes having a second parameter. The second parameter is different than the first parameter.

In accordance with another preferred embodiment of the present invention, a semiconductor device includes a first transistor, the first transistor including at least two first gate electrodes, and the at least two first gate electrodes having a first thickness. A second transistor is disposed proximate the first transistor, the second transistor including at least two second gate electrodes, the at least two second gate electrodes having a second thickness, the second thickness being different than the first thickness. The first thickness establishes a first work function of the at least two first gate electrodes, and the second thickness establishes a second work function of the at least two second gate electrodes, wherein the second work function is different than the first work function.

In accordance with yet another preferred embodiment of the present invention, a semiconductor device includes a first transistor including at least two first gate electrodes, the at least two first gate electrodes having a first dopant level. A second transistor is disposed proximate the first transistor, the second transistor including at least two second gate electrodes, and the at least two second gate electrodes having a second dopant level. The second dopant level is different than the first dopant level. The first dopant level establishes a first work function of the at least two first gate electrodes, and the second dopant level establishes a second work function of the at least two second gate electrodes. The second work function is different than the first work function.

In accordance with another preferred embodiment of the present invention, a method of manufacturing a semiconductor device includes forming a first transistor, the first transistor including at least two first gate electrodes, and the at least two first gate electrodes having a first parameter. A second transistor is formed proximate the first transistor, the second transistor including at least two second gate electrodes, and the at least two second gate electrodes having a second parameter. The second parameter is different than the first parameter.

Advantages of preferred embodiments of the present invention include providing novel methods of fabricating transistor devices and structures thereof. Multiple gate CMOS devices may be manufactured, wherein the PMOS transistor and NMOS transistor of the multiple gate CMOS devices have a substantially symmetric $V_t$. The thickness of the metal gate materials, and/or the dopant level of the gate electrode material, establish the work function of the transistor gate electrodes, and thus establishes the threshold voltage $V_t$ of the transistors. In some embodiments, the same material is preferably used for the gate of the PMOS and NMOS transistor, resulting in reduced efforts that would be required for depositing and etching two different gate materials, and also resulting in the prevention of contamination in manufacturing process tools. In other embodiments, a single type of gate material is deposited, and either the PMOS device or the NMOS transistor gate electrode material is implanted with a dopant species to adjust the work function.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures, such as capacitors or gated diodes, as examples, or other processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which:

FIGS. 1 through 5 show cross-sectional views of a semiconductor device at various stages of manufacturing in accordance with a preferred embodiment of the present invention, wherein a CMOS device comprises a multi-gate PMOS transistor and NMOS transistor having different gate material thicknesses;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 3:
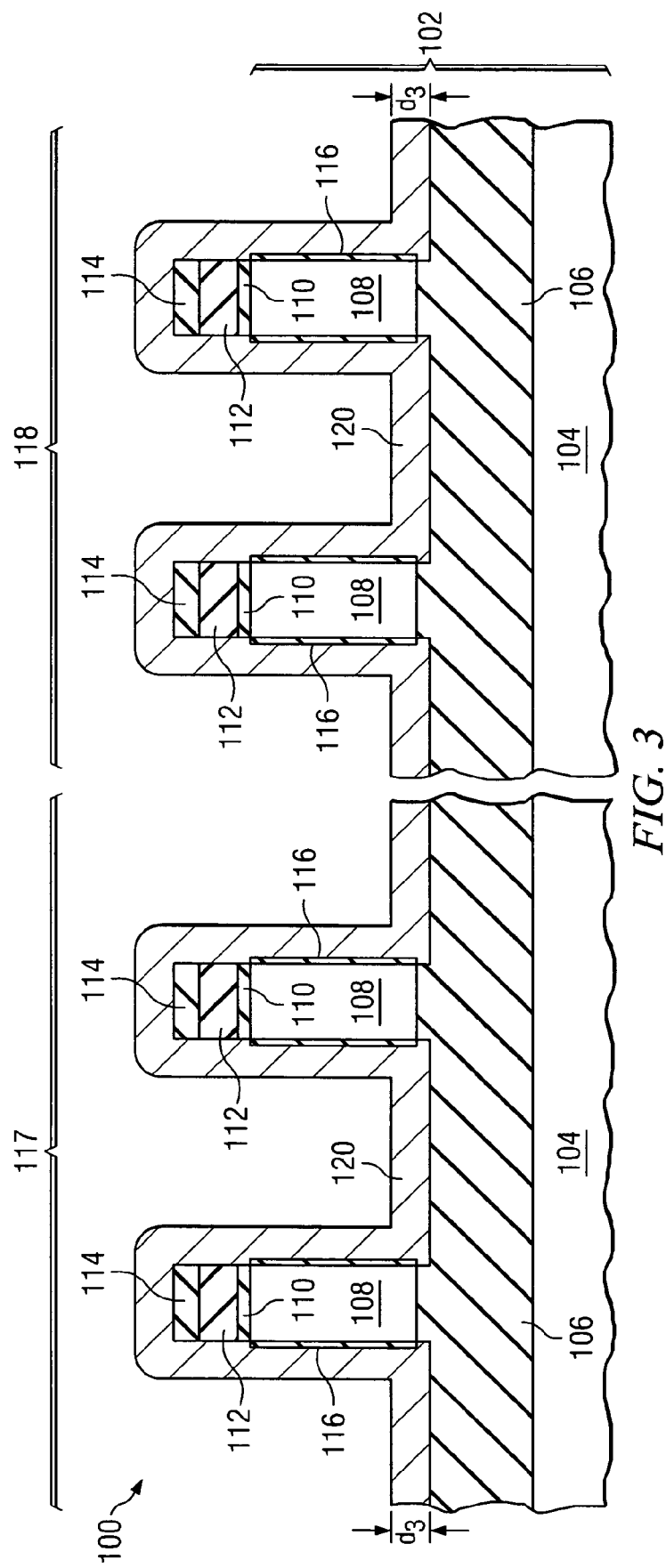

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric.

Semiconductor materials have traditionally been used in the past as a gate electrode material for transistor devices. The work function of a semiconductor material can be changed by doping the semiconductor material. For example, undoped polysilicon has a work function of about 4.65 eV, whereas polysilicon doped with boron has a work function of about 5.15 eV. When used as a gate electrode, the work function of a semiconductor or conductor directly affects the threshold voltage of a transistor, for example.

To achieve the device performance required of advanced transistor designs, there is a move towards the use of metal gate electrode materials and high k dielectric materials as the gate dielectric material. A metal-gate is preferred over a conventional polysilicon gate to avoid the gate depletion effect and reduce the equivalent oxide thickness (EOT). However, suitable metals have not yet been found for use as metal gates of CMOS devices, particularly for CMOS devices having high k dielectric materials for gate dielectric materials. In particular, gate material engineering for multiple gate transistors is proving challenging.

The term "mid-gap" gate work function is defined herein to be around 4.65 eV, because this is the mid value of the work functions of n-doped poly-crystalline silicon, which is about 4.1 eV and p-doped poly-crystalline silicon, which is about 5.2 eV. The difference of 4.1 eV and 5.2 eV is the energy gap of 1.1 eV between the valence band and the conduction band, for example. The term "near-mid-gap" is defined herein to be a work function close to about 4.65 eV. For example, about 4.45 eV is a near-midgap work function for an NMOS device, and about 4.85 eV is a near-mid-gap work function for a PMOS device.

What are needed in the art are metal gate electrodes that have a suitable work function for multiple gate CMOS devices. For CMOS FinFET technology to provide a maximum performance benefit over bulk-Si CMOS technology, one issue that needs to be resolved is the development of a tunable work function gate technology for threshold voltage $V_t$ control.

One aspect of embodiments of the present invention is to find two near mid-gap metal gate materials with work functions of about 4.45 eV and 4.85 eV, e.g., for a multiple gate NMOS device and a multiple gate PMOS device, respectively. These work functions would achieve a symmetrical $V_{tn}$ and $V_{tp}$ (e.g., $V_{tn}$=+0.3 V and $V_{tp}$=−0.3 V), which is required for a CMOS device. Another aspect of embodiments of the present invention is to integrate these two metal gate materials into a multi-gate device process flow.

Embodiments of the present invention achieve technical advantages by disclosing metals that are useful as a gate material in a multi-gate CMOS transistor, for both an NMOS transistor and a PMOS transistor. In one embodiment, the gate material preferably comprises TiSiN. In other embodiments, the gate material preferably comprises TaN or TiN. The gate material may also comprise other materials. The work function of the NMOS transistor and PMOS transistor is adjusted by tuning or adjusting the thickness of the gate material, in some embodiments. Because the gate material adjacent the gate dielectric is a metal, Fermi-pinning effects, that may be caused by the use of high k dielectric materials for the gate dielectric, are avoided. In some embodiments, the multiple gates of the NMOS and PMOS transistor may also include a layer of semiconductive material disposed at a top surface thereof, for example.

The present invention will be described with respect to preferred embodiments in a specific context, namely in a CMOS FinFET device. Embodiments of the present invention may also be applied, however, to other semiconductor device applications where transistors having two or more gate electrodes are utilized, such as a tri-gate device, as an example. Note that in the drawings, only one CMOS device is shown; however, there may be many transistors formed on a semiconductor workpiece during each of the manufacturing processes described herein.

The metal layers described herein can be deposited and etched very accurately by varying the process conditions. The term "gate" and "gate electrode" refer to the gate of a transistor, and these terms are used interchangeably herein.

FIGS. 1 through 5 show cross-sectional views of a semiconductor device 100 at various stages of manufacturing in accordance with a preferred embodiment of the present invention, wherein a CMOS device comprises a multi-gate PMOS transistor and NMOS transistor having different gate material thicknesses. With reference now to FIG. 1, there is shown a semiconductor device 100 in a cross-sectional view including a workpiece 102. The workpiece 102 preferably comprises an SOI substrate. The SOI substrate includes a first layer of semiconductive material 104 that comprises a substrate, a buried insulating layer 106 or buried oxide layer disposed over the first layer of semiconductive material 104, and a second layer of semiconductive material 108 disposed over the buried insulating layer 104, for example. The workpiece 102 may also include other active components or circuits formed in other regions of the workpiece 102, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may be doped with P type dopants and N type dopants, e.g., to form P wells and N wells, respectively (not shown). The second layer of semiconductor material 108 may comprise silicon (Si) having a thickness of about 100 nm, for example, although alternatively, the second layer of semiconductor material 108 may comprise other materials and dimensions.

A hard mask 110/112/114 is formed over the workpiece 102. The hard mask 110/112/114 comprises a first oxide layer 110 comprising about 5 nm or less of $SiO_2$ formed over the workpiece 102. A nitride layer 112 comprising about 20 nm of $Si_xN_y$ is formed over the first oxide layer 110. A second oxide layer 114 comprising about 20 nm or less of $SiO_2$ is formed over the nitride layer 112. Alternatively, the hard mask 110/112/114 may comprise other materials and dimensions, for example.

The semiconductor device 100 includes at least one first region 117 wherein a PMOS device will be formed, and at least one second region 118 wherein an NMOS device will be formed, as shown. Only one first region 117 and one second region 118 are shown in the figures; however, there may be many first regions 117 and second regions 118 formed on a semiconductor device 100, for example. The first region 117 and the second region 118 may be separated by isolation regions (not shown in FIG. 1; see FIG. 14, at 392, for example).

The hard mask 110/112/114 is patterned using lithography, e.g., by depositing a layer of photoresist over the hard mask 110/112/114, exposing the layer of photoresist to energy using a lithography mask, developing the layer of photoresist, and using the layer of photoresist as a mask to pattern the hard mask 110/112/114, for example. The hard mask 110/112/114, and optionally, also the layer of photoresist are used as a mask to pattern the second layer of semiconductive material 108 of the workpiece 102, as shown in FIG. 2. The buried insulating layer 106 may comprise an etch stop layer for the etch process of the second layer of semiconductive material 108, for example. A top portion of the buried insulating layer 106 may be removed during the etch process of the second layer of semiconductive material 108, as shown. For example, the buried insulating layer 106 may have a thickness of about 150 nm, and may be etched by an amount $d_1$ comprising about 15 nm or less, although alternatively, $d_1$ may comprise other dimensions.

The second layer of semiconductor material 108 forms vertical fins of semiconductor material 108 extending in a vertical direction away from a horizontal direction of the workpiece 102. The fin structures 108 will function as the channels of PMOS and NMOS devices, to be described further herein. The fin structures 108 have a thickness $d_2$ that may comprise about 50 nm or less, as an example, although alternatively, the fins may comprise other dimensions. For example, the thickness $d_2$ of the fin structures 108 may comprise about 5 to 60 nm, or less, in some applications. As another example, the thickness $d_2$ of the fin structures may be larger, such as having a thickness $d_2$ of about 100 to 1,000 nm. The thickness $d_2$ of the fin structures 108 may vary as a function of the channel doping and other dimensions of the fin structures 108, as examples, although other parameters may also have an effect on the determination of the dimension $d_2$.

The fin structures 108 have a height equivalent to the thickness of the second layer of semiconductor material 108, for example. Only two fin structures 108 are shown in the first region 117 and the second region 118 of the semiconductor device 100; however, there may be many fin structures, e.g., about 1 to 200 fin structures, for each PMOS and NMOS device, as examples, although alternatively, other numbers of fin structures 108 may be used.

A gate dielectric 116 is formed over the sidewalls of the fins of semiconductor material 108, as shown in FIG. 2. The gate dielectric 116 may be formed using a thermal oxidation process, for example, wherein only the semiconductor material 108 is oxidized, as shown. Alternatively, the gate dielectric 116 may be formed using a deposition process, resulting in a thin layer of the gate dielectric 116 also being formed on the buried insulating layer 106 and the hard mask 110/112/114 (not shown), for example. The gate dielectric preferably comprises a hafnium-based dielectric, $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples, although alternatively, the gate dielectric 116 may comprise other materials.

The gate dielectric 116 preferably comprises a high k dielectric material having a dielectric constant greater than the dielectric constant of $SiO_2$ in some embodiments. For example, the gate dielectric material 116 preferably comprises a high k dielectric material having a dielectric constant of about 4.0 or greater, for example. The gate dielectric material 116 preferably comprises a thickness of about 50 Angstroms or less in one embodiment, although alternatively, the gate dielectric material 116 may comprise other dimensions.

Next, a gate electrode material 120 having a thickness $d_3$ is formed over the fin structures in the first region 117 and second region 118, as shown in FIG. 3. The gate electrode material 120 preferably comprises a thickness $d_3$ of about 500 Angstroms or less, for example, although alternatively, the gate electrode material 120 may comprise other dimensions.

The gate electrode material 120 preferably comprises TiSiN, in one embodiment, which is a material that has a variable work function, depending on the thickness. The gate electrode material 120 may alternatively comprise TaN, or TiN, as examples. In other embodiments, the gate electrode material 120 preferably comprises TiSiN, TiN, TaN, Ta, Ru, HfN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, partially silicided materials thereof, fully silicided materials thereof, and/or combinations thereof, as examples, although alternatively, the gate electrode material 120 may comprise other materials. The gate electrode material 120 preferably comprises a material for which the work function may be changed by changing the thickness of the material, for example.

The gate electrode material 120 may be deposited by chemical vapor deposition (CVD), atomic layer deposition (ALD), metal organic chemical vapor deposition (MOCVD), physical vapor deposition (PVD), or jet vapor deposition (JVD), as examples, although alternatively, the gate electrode material 120 may be deposited using other suitable deposition techniques.

The gate electrode material 120 comprises a first gate electrode on a first sidewall of a fin of semiconductor material 108, and a second gate electrode on a second sidewall of the fin of semiconductor material 108 opposite the first sidewall. Thus, a FinFET having a dual gate electrode structure is formed on each fin of semiconductor material 108. Again, several fins 108 may be placed in parallel to form a PMOS device in the first region 117 or to form an NMOS device in the second region 118 of the workpiece 102, for example.

If the gate electrode material 120 comprises TiSiN, preferably the gate electrode material 120 is formed by CVD using precursors and gases of TDEAT at 0.11 g/min, $SiH_4$ at about 100 standard cubic centimeters per minute (s.c.c.m.), $NH_3$ at about 5,800 s.c.c.m., at a temperature of about 340 degrees C. and a pressure of about 60 Torr, as examples, although other methods and processing parameters may also be used to form the gate electrode material 120.

Figure 4:
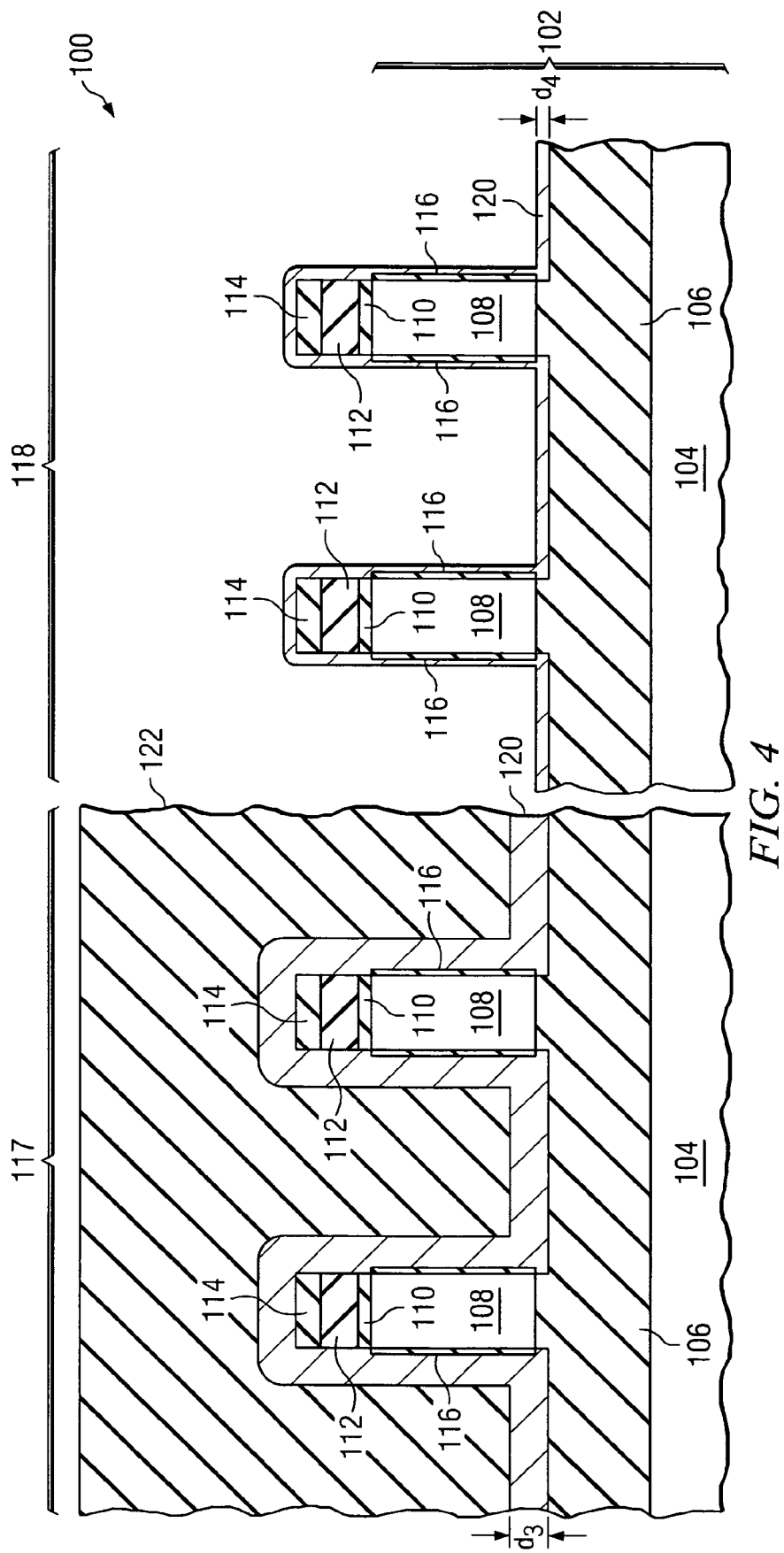

Next, the first region 117 of the workpiece 102 is covered with a mask 122, as shown in FIG. 4. The mask 122 may be deposited on the entire surface of the workpiece 102 and removed using lithography from over the second region 118 to expose the gate electrode material 120 in the second region 118, for example. The mask 122 may comprise a layer of photoresist and/or a hard mask, for example. The mask 122 preferably comprises a nitride material such as $Si_xN_y$, in one embodiment, as an example, although other materials may also be used.

The mask 122 is used as a mask while at least a top portion of the gate electrode material 120 is removed from the second region 118 of the workpiece 102, as shown in FIG. 4. The removal process for the top portion of the gate electrode material 120 may comprise an etch process, such as a timed etch process and/or a wet etch process, as examples, although alternatively, other etch processes may be used. The etch process may comprise an isotropic dry etch such as a reactive ion etch (RIE), a wet etch, or an atomic layer etch, such as a reverse ALD process, as examples. The mask 122 protects the gate material 120 in the first region 117 from being removed during the etch process, for example.

The gate electrode material 120 in the second region 118 preferably comprises a thickness $d_4$ of about 100 Angstroms or less after the etch process to remove the top portion of the gate electrode material 120, for example. The thickness $d_3$ of the gate electrode material 120 in the first region 117 for PMOS devices is preferably greater than the thickness $d_4$ of the gate electrode material 120 in the second region 118 for NMOS devices, for example. The gate electrode material 120 thicknesses $d_3$ and $d_4$ are preferably selected according to the desired work function of the gate electrode material 120 in the first region 117 and second region 118, in accordance with embodiments of the present invention, for example.

Figure 5:
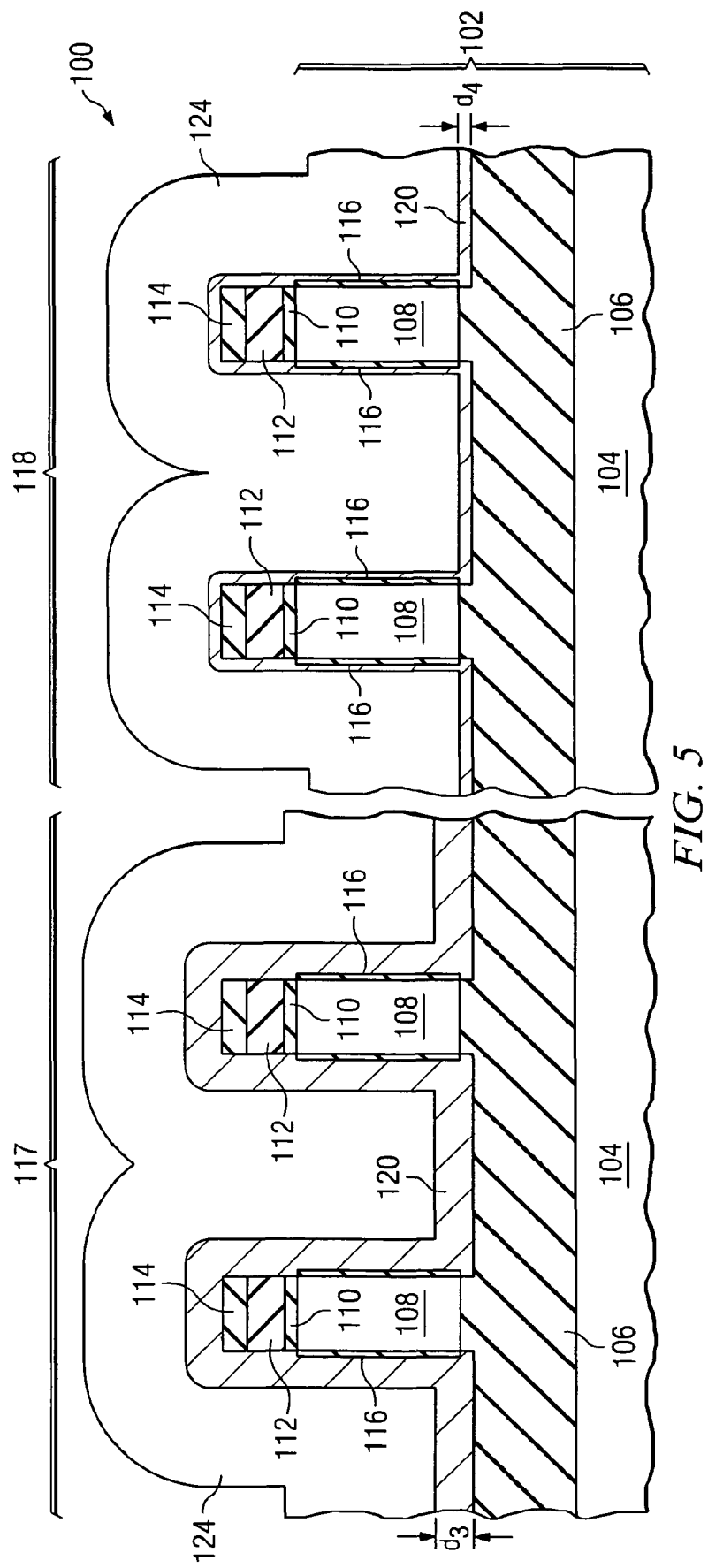

The hard mask 122 is removed, e.g., using hot phosphoric acid, if the hard mask 122 comprises silicon nitride, although other chemistries may also be used. An optional layer of semiconductive material 124 may be formed over the gate electrode material 120, as shown in FIG. 5. The layer of semiconductive material 124 may comprise polysilicon having a thickness of about 2,000 Angstroms or less, although alternatively, the layer of semiconductive material 124 may comprise other dimensions and materials, for example. The semiconductive material 124 comprises part of a gate electrode of the transistors formed in the first region 117 and second region 118 of the workpiece 102, for example.

In one embodiment, not shown in the figures, preferably all of the gate electrode material 120 is removed from over the second region 118 in the etch process. In this embodiment, preferably, another layer of gate electrode material is then deposited over the second region 118 and over the hard mask 122. Or, alternatively, the hard mask 122 may be removed before the additional layer of gate electrode material is deposited, to re-deposit a gate electrode material on the second region 118 of the workpiece. The additional layer of gate electrode material preferably comprises the same materials listed as preferred materials for the gate electrode material 120, for example.

Figure 13:
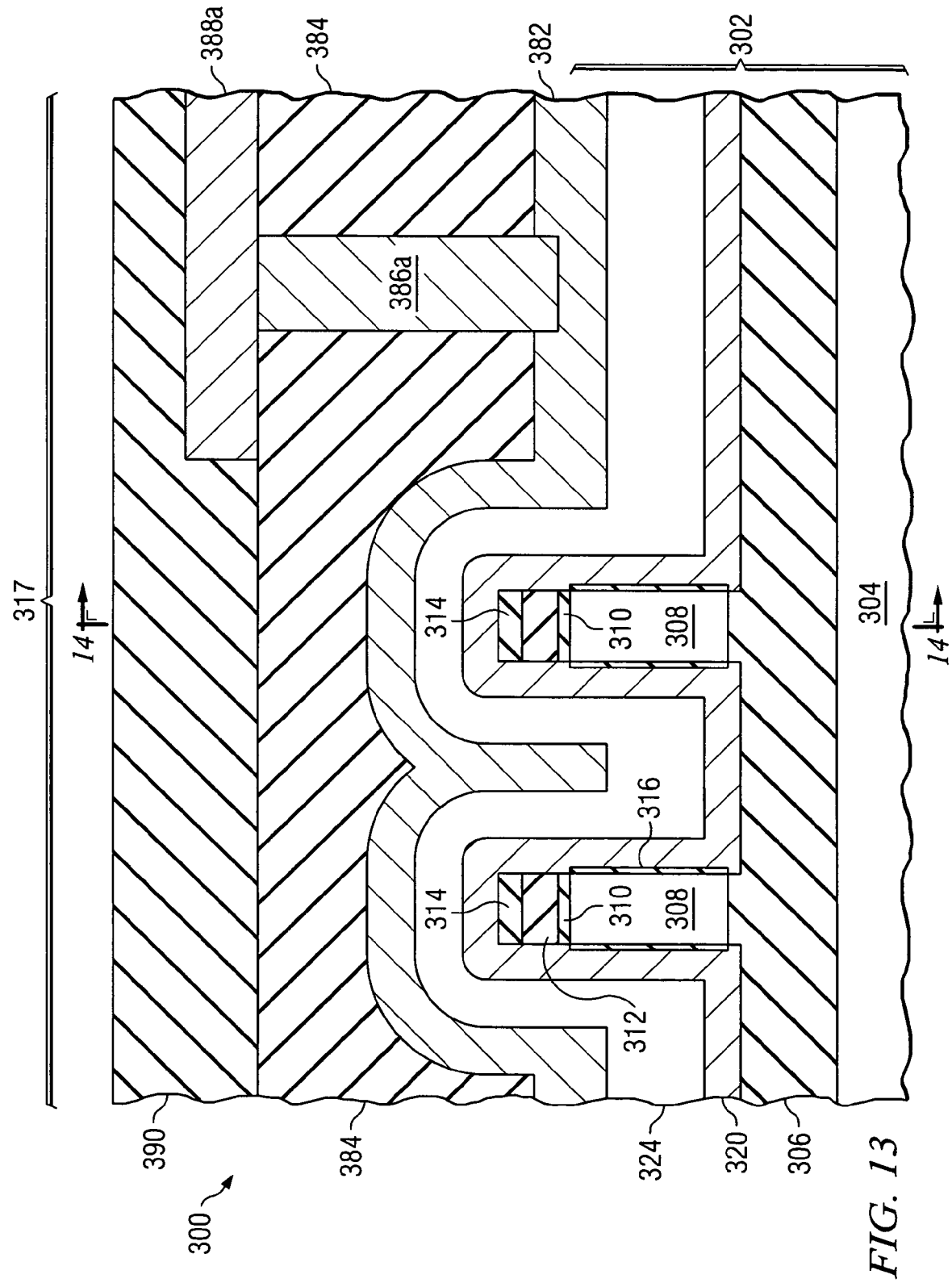
FIG. 13 shows a FinFET device in accordance with embodiments of the present invention, after the formation of upper metallization and insulating layers over the FinFET device.
Figure 14:
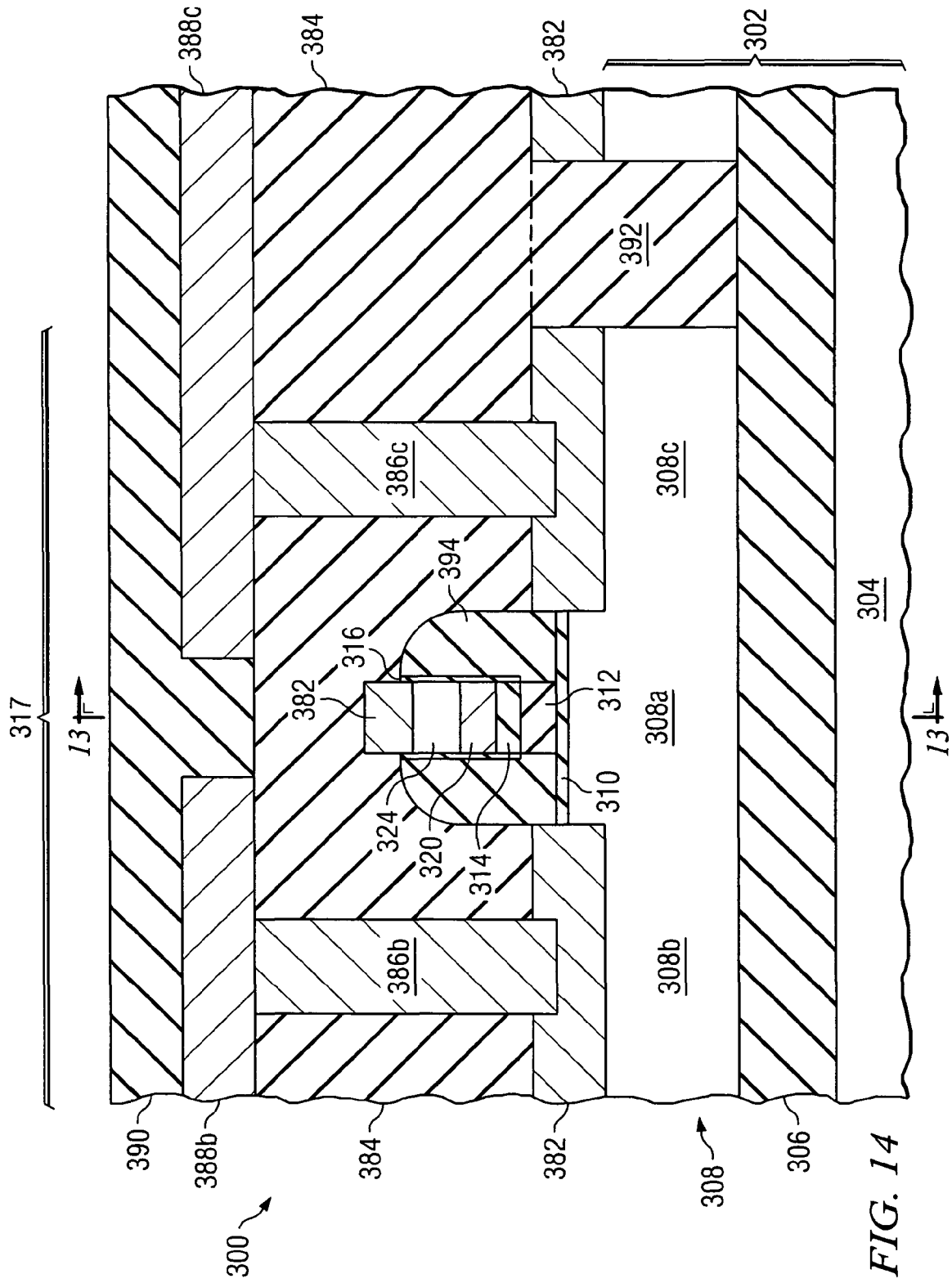
FIG. 14 shows a fin structure of the FinFET device shown in FIG. 13 in a view perpendicular to the view shown in FIG. 13.

The manufacturing process for the semiconductor device 100 is then continued. For example, portions of the gate electrode material 120 may be removed to form the gate electrodes for the CMOS FinFETs, e.g., the gate electrode material 120 and optional semiconductor material 124 are simultaneously patterned for the first region 117 and the second region 118 to form the gate electrodes of the PMOS and NMOS multiple gate transistors in the first region 117 and the second region 118, respectively. Additional insulating material layers may be formed over the gate electrodes. Contacts may be made to the source, drain, and gate electrodes of the FinFETs, for example, as shown in FIGS. 13 and 14 (to be described further herein).

Advantageously, a CMOS FinFET device is formed, wherein a multiple gate PMOS device in the first region 117 comprises a thicker gate electrode 120 than a multiple gate NMOS device in the second region 118. The gate electrode 120 of the multiple gate PMOS device preferably has a thickness that is greater than the thickness of the gate electrode 120 of the multiple gate NMOS device by about 50 Angstroms or more, for example.

Figure 6:
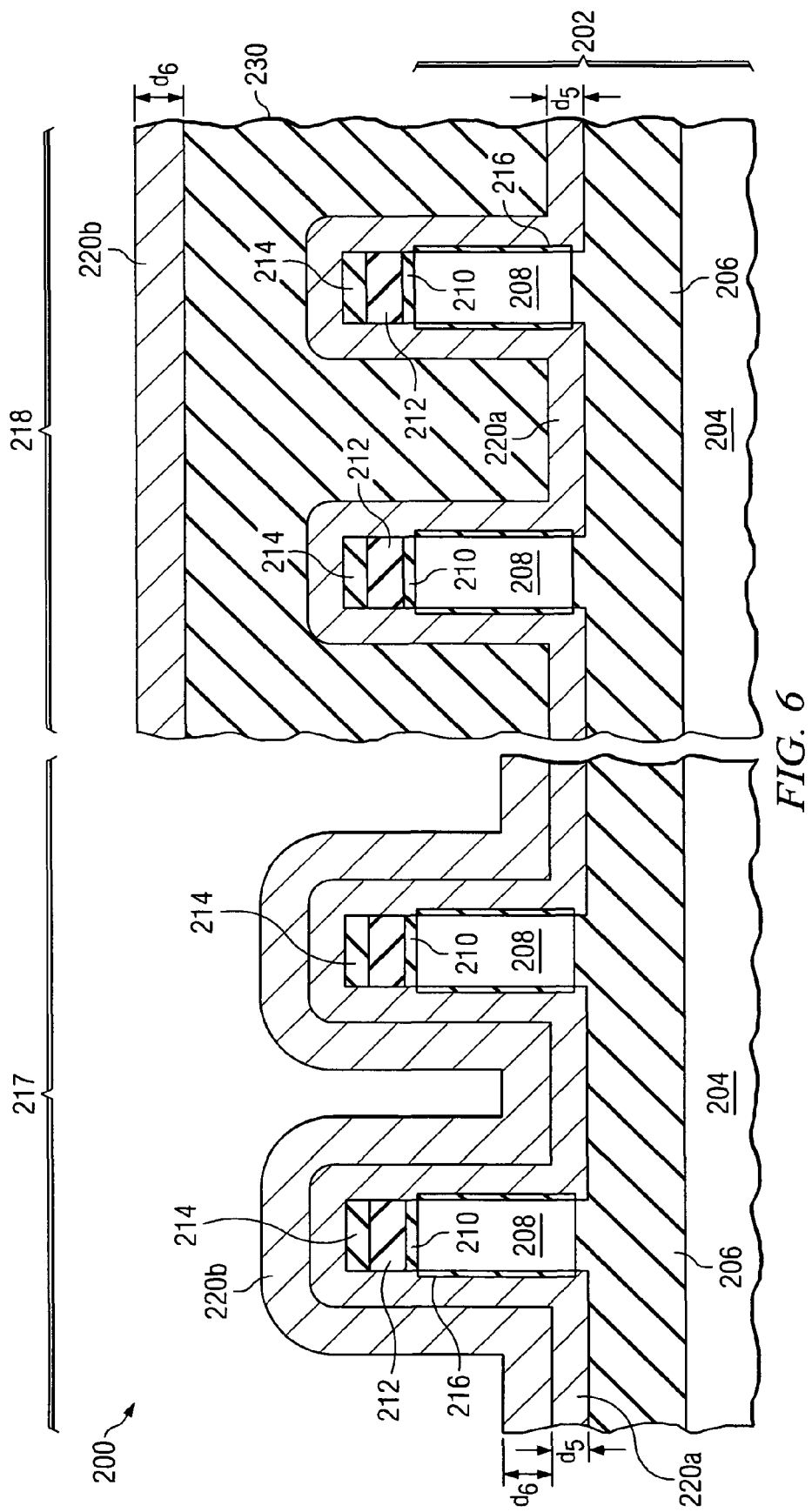
FIGS. 6 and 7 show cross-sectional views of another method of manufacturing a CMOS device comprising multi-gate transistors and having different gate material thicknesses in accordance with an embodiment of the present invention.
Figure 7:
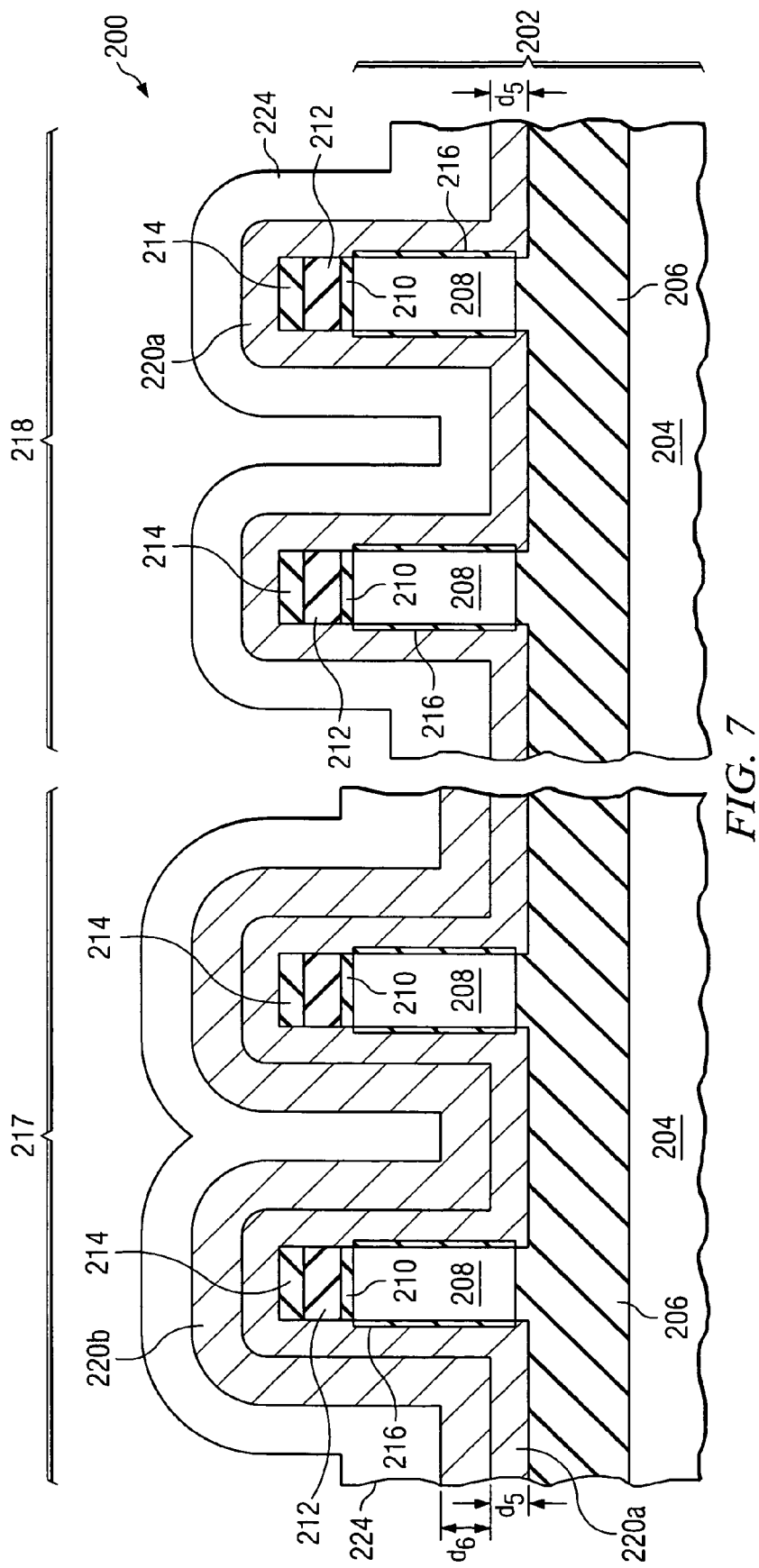

FIGS. 6 and 7 show cross-sectional views of another method of manufacturing a CMOS device comprising multi-gate transistors and having different gate material thicknesses in accordance with an embodiment of the present invention. Like numerals are used in FIGS. 6 and 7 as were used in FIGS. 1 through 5, and similar materials and thicknesses are preferably used as were described for the previously described embodiment.

In this embodiment, a first gate material 220a having a thickness $d_5$ is formed over the fin structures 208 (e.g., over gate dielectric 216 and hard mask 210/212/214 disposed over the fin structures 208), as shown in FIG. 6. A mask 230 comprising a layer of photoresist or a hard mask, as examples, is formed over the second region 218 of the semiconductor device 200. A second gate material 220b thickness $d_6$ is formed over the first gate material 220a in the first region 217 and over the mask 230 in the second region 218. Using a lift-off technique, the second gate material 220b is removed from over the second region 218 when the mask 230 is removed, as shown in FIG. 7.

Thus, as in the embodiment shown in FIGS. 1 through 5, the gate electrode 220a/220b in the first region 217 comprises a thickness $d_5+d_6$ that is greater than the thickness $d_5$ of the gate electrode 220a in the second region 218, as shown. Again, a layer of semiconductor material 224 may be formed over the gate electrode material 220a/220b in the first region 217 and over the gate electrode material 220a in the second region 218, as shown in FIG. 7.

Figure 8:
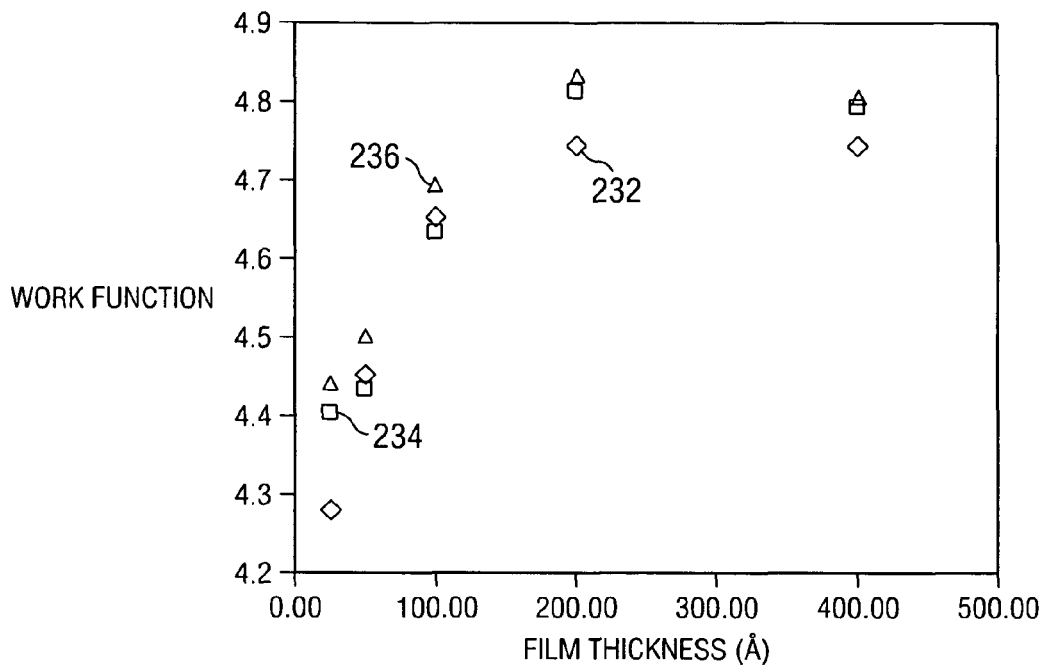
FIG. 8 is a graph showing the work function for several types and thicknesses of gate dielectric materials in accordance with embodiments of the present invention.

FIG. 8 is a graph showing the work function of a TiSiN gate electrode with a different thickness on several types of gate dielectric materials in accordance with embodiments of the present invention. A TiSiN gate electrode material 116/216 having various thicknesses comprising gate dielectric $SiO_2$ is shown at 232; a TiSiN gate electrode material 116/216 comprising gate dielectric $HfO_x$ is shown at 234; and a TiSiN gate electrode material 116/216 comprising gate dielectric $HfSiO_x$ is shown at 236. The work function, shown on the y axis, varies according to the TiSiN gate electrode material 116/216 thickness, shown in Angstroms on the x axis.

Figure 9:
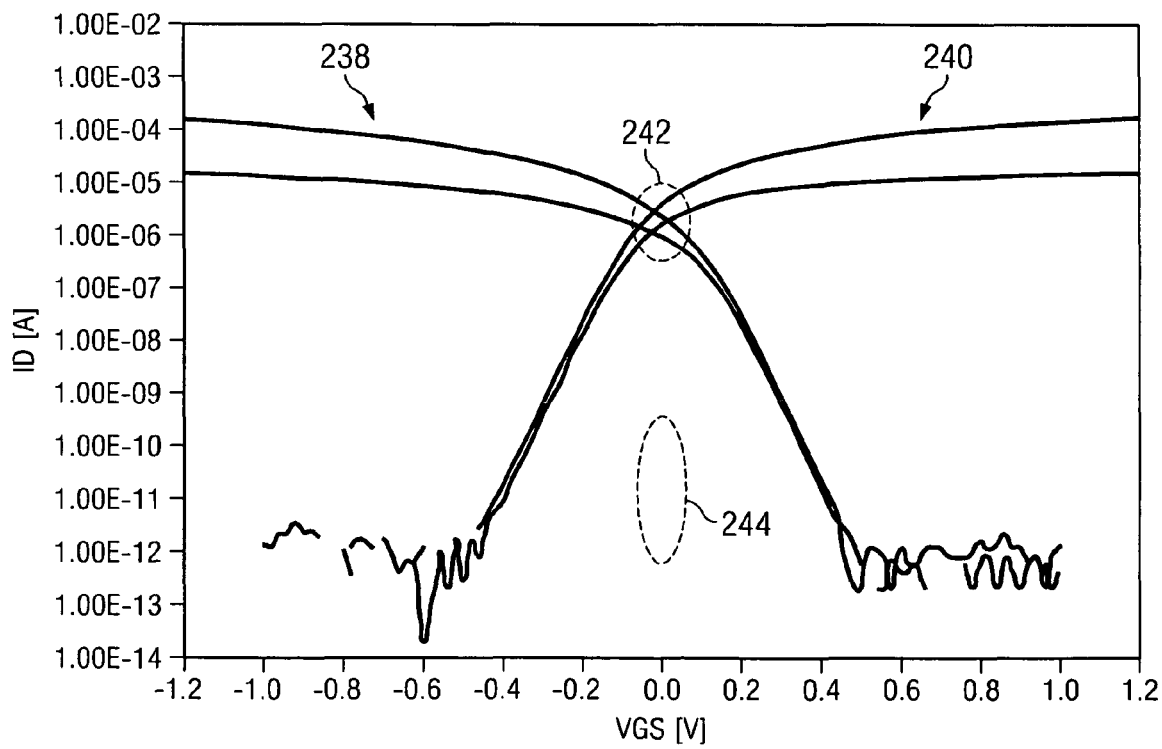
FIG. 9 shows transfer characteristics of a PMOS and NMOS FinFET with undoped channels and polysilicon as a gate material, illustrating the impact that embodiments of the present invention can have on the transfer characteristics of a FinFET CMOS device.

FIG. 9 shows transfer characteristics of a PMOS and NMOS FinFET with undoped channels and polysilicon as a gate material for two different drain to source voltages (VDS) each, illustrating the impact that embodiments of the present invention can have on the transfer characteristics. The drain current ID is shown on the y axis as a function of the gate to source voltage VGS on the x axis. The curves at 238 show transfer characteristics of a PMOS FinFET with undoped channels and polysilicon as a gate material (e.g., a conventional planar PMOS short channel device would exhibit similar curves as 238), and the curves at 240 show transfer characteristics of a NMOS FinFET with undoped channels and polysilicon as a gate material (e.g., a conventional planar NMOS short channel device would exhibit similar curves as 240). The two sets of curves 238 and 240 cross at a VGS of 0 at a drain current ID of about 1.00E-05 to 1.00E-06 (see region 242) for a prior art CMOS device. In accordance with embodiments of the present invention, advantageously, because the work function is adjusted using the gate electrode material thickness, the transfer characteristic curves may be tuned to cross at an ID of about 1.00E-12 to 1.00E-10, as shown at 244. A transistor off-current of 1.00E-11, for example, is better than an off-current of 1.00E-5 for some CMOS devices, because this will greatly reduce the power consumption of the entire electronic circuit, e.g., the electronic circuit that the CMOS transistor is formed in, which also may include other transistors and circuit elements. If the power consumption is reduced, then for instance, if the transistor is used in a mobile application such as a cell phone, personal digital assistant (PDA) or laptop computer, then the mobile application can advantageously operate longer in a standby mode without the need of charging the batteries.

Other parameters of gate electrode materials may be varied to tune the work function of the gate electrode material and also the PMOS and NMOS transistor, in accordance with embodiments of the present invention, to be described further herein.

In a paper entitled, "An Adjustable Work Function Technology Using Mo Gate for CMOS Devices," by Lin, R., et al, in IEEE Electron Device Letters, January 2002, pp. 49-51, Vol. 23, No. 1, IEEE, which is incorporated herein by reference, implanting Mo with N is disclosed, which was found to shift a work function of a gate electrode comprising Mo slightly. However, the work function shift in a relatively thick Mo film (650 A) based on a nitrogen implantation which uses a high energy (29 keV) and a high dose (5E15 cm-2) is insufficient for FinFET or tri-gate devices with thin fins, because the nitrogen implantation will degrade the source and drain regions, which are typically formed by lower energies and doses.

Figure 10:
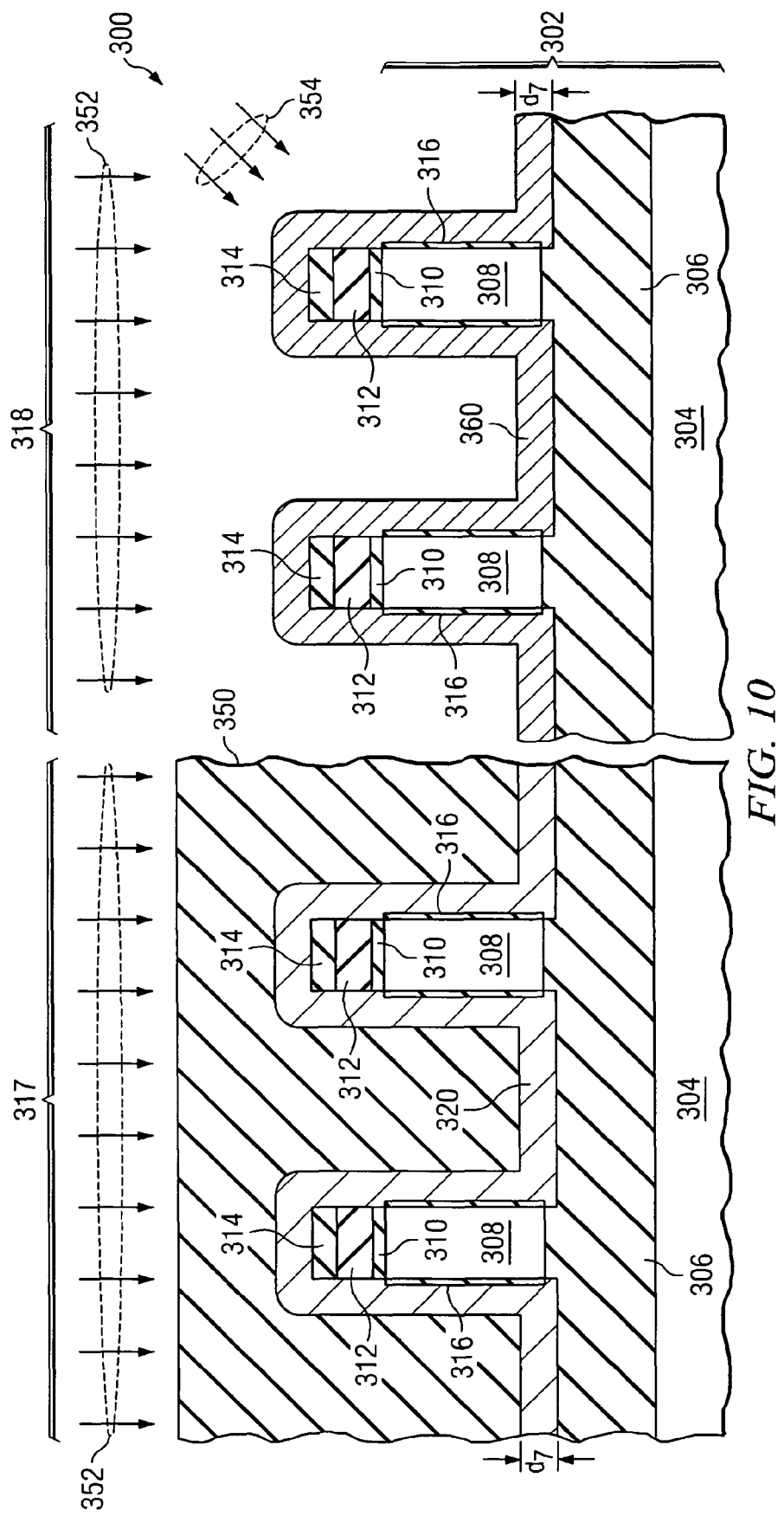
FIG. 10 shows a cross-sectional view of another embodiment of the present invention, wherein the work function of an NMOS transistor is adjusted by implanting a dopant species into the gate material.

Referring next to FIG. 10, embodiments of the present invention achieve technical advantages by implanting a dopant species 352/354 into a metal gate electrode 320 of at least one of the transistors of a CMOS FinFET device, to tune the work function of the metal gate electrode 320/360. FIG. 10 shows a cross-sectional view of an embodiment of the present invention, wherein the work function of an NMOS FinFET transistor in the second region 318 is adjusted by implanting a dopant species 352/354 into the gate electrode material 320. Like numerals are used as were used in the previous figures.

Preferably, the gate electrode materials 320/360 and the dopant species 352/354 are selected so that a work function shift of at least 200 mV is achieved, in some embodiments, for example, although alternatively, other work function shifts may be achieved. Also, in other embodiments, the dopant or dopants used for the gate implant comprises the same dopant that is used to form source and drain regions (not shown in FIG. 10; see source region 308b and drain region 308c in FIG. 14) of a multiple gate device. The gate dopant implantation process preferably has a lower energy and a lower dose as the implantation process used to form source and drain regions 308b and 308c, so that the gate implantation will not overcompensate the source and drain region 308b/308c implantation process, for example.

Referring again to FIG. 10, in one embodiment, the gate electrode material 320 preferably comprises TiSiN, and at least one of the transistors, e.g., the NMOS transistor in the second region 318, is implanted with a dopant species 352/354 comprising Si. In other embodiments, the materials of the gate electrode 320 preferably comprise TiSiN, TiN, TaN, Ta, Ru, Mo, HfN, W, Al, Ru, RuTa, TaSiN, NiSi$_x$, CoSi$_x$, TiSi$_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof. The dopant species 352/354 implanted into at least one of the gate electrode materials 320 preferably comprises Si, B, As, P, C, Ge, or Sb, or combinations thereof.

In some embodiments, the dopant species 352/354 preferably comprises a material other than nitrogen (N), for example, because N implantation is typically too strong and may deleteriously affect the source and drain regions (see regions 308b and 308c in FIG. 4). Preferably the implantation process to implant the dopant species 352/354 is weaker than, or no stronger than, e.g., in implantation dose and power level, than the implantation process to form the source and drain regions 308b and 308c, for example, so as to not overcompensate the source 308b and drain 308c region implantation process. In some embodiments, the same dopant species may be implanted into the gate electrode material 320 that is used to form the source 308b and drain 308c regions, for example.

Referring again to FIG. 10, after the gate electrode material 320 is deposited over both the first region 317 and the second region 318, a mask 350 is formed over the first region 317. The mask 350 may be formed over both the first region 317 and the second region 318 and then removed from over the second region 318, for example. The mask 350 may comprise a layer of photoresist or a hard mask comprising an insulator, as examples.

The gate electrode material in the second region 318 is implanted with a dopant species 352, as shown. The mask 350 protects the gate electrode material 320 in the first region 317 during the implantation process. The gate electrode material 360 is altered in the second region 318 and may comprise a graded concentration of the dopant species 352 throughout the gate electrode material 320. For example, the gate electrode material 360 may comprise a higher concentration of the dopant species 352 at a top surface of the gate electrode material 360 than at a bottom surface proximate the buried insulating layer 306, or at a sidewall surface of the fins 308.

In some embodiments, the gate electrode material 320 in both first region 317 and the second region 318 may be implanted with a first level of dopant. Then, the first region 317 is masked, and the gate electrode material 320 in the second region 318 is implanted with an additional amount of the dopant to set a second level of dopant in the second region 318 that is different than the first level of dopant in the first region 317, for example.

In one embodiment, the implantation process is preferably directed at an angle towards the workpiece 302, as shown at 354. The angle preferably comprises an angle of about 30 to 60 degrees with respect to a top surface of the workpiece 302 (which would be 0 degrees), as an example, although other angles may alternatively be used. The fins 308 may comprise a relatively high aspect ratio, and angling the direction of the implantation process 354 assists in implanting the dopant species 354 in the gate electrode material 320 along the sidewall of the fins 308, for example.

In some embodiments, the workpiece 302 is rotated several times and the implantation process 354 directed at an angle is repeated to implant each side of the gate electrode material 360 on the fins 308. For example, the workpiece 302 may be implanted a first time, and the workpiece 302 may be rotated by 90 degrees. The workpiece 302 is implanted a second time, and the workpiece 302 is rotated by 90 degrees again. The workpiece is preferably implanted and rotated to implant all sidewalls of the gate electrode material 360 in some embodiments; e.g., including four implantation processes and three rotations.

In other embodiments, preferably, at least one side of the gate electrode material 360 is implanted with a higher concentration of dopants along one sidewall of the fin 308 than on another sidewall of the fin 308, for example. In these embodiments, the workpiece 302 may not be rotated at all and may have a single dopant implantation step. Alternatively, the workpiece 302 may be rotated only once, for example, before a second dopant implantation process is performed. For example, the dopant species may be implanted onto a first sidewall of a fin structure, but not the second sidewall of the fin structure.

An experimental result of implanting a dopant species to adjust the work function will next be described. A gate electrode material comprising TiSiN having a thickness of 250 Angstroms having an initial Si concentration of about 25 to 30% was deposited. An example of a CMOS FinFET process with symmetric work functions around a mid-gap level (4.65 eV) and with 6 different kinds of devices is shown in Table 1:

TABLE 1

| Device type | Gate Dielectric | Si additional dose | Work function |
|---|---|---|---|
| PMOS high-performance | HfSiO$_x$ | 0.3E15 cm-2 | 4.85 eV |
| PMOS low-power | SiO$_2$ | None | 4.75 eV |
| PMOS low-standby-power | SiO$_2$ | 0.3E15 cm-2 | 4.65 eV |

TABLE 1-continued

| Device type | Gate Dielectric | Si additional dose | Work function |
|---|---|---|---|
| NMOS low standby-power | $SiO_2$ | 0.3E15 cm-2 | 4.65 eV |
| NMOS low-power | $SiO_2$ | 1E15 cm-2 | 4.55 eV |
| NMOS high-performance | $SiO_2$ | 2E15 cm-2 | 4.45 eV |

The most successful results that resulted in the greatest impact on the work function due to changing the implantation dose, were seen in both PMOS and NMOS devices having a gate dielectric comprised of $SiO_2$ dielectric, for example.

Figure 11:
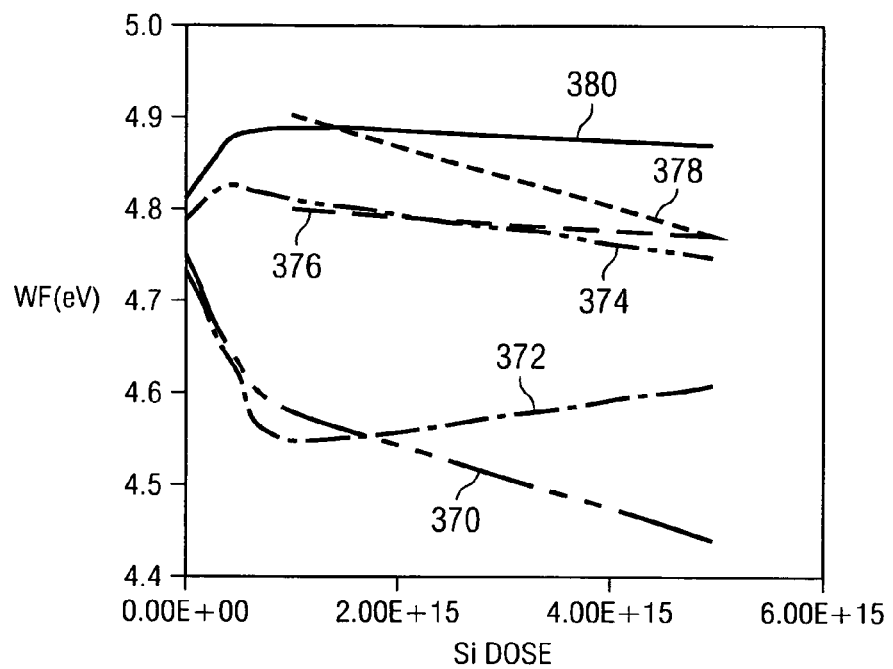
FIG. 11 is a graph of the work function of TiSiN for various types of transistor devices at various doping levels of silicon, with various gate dielectric materials in accordance with an embodiment of the present invention.

FIG. 11 is a graph of the work function of TiSiN for various types of transistor devices as various doping levels of silicon, with various gate dielectric materials in accordance with an embodiment of the present invention. Table 2 shows the materials and element numbers for the graph shown in FIG. 11.

TABLE 2

| Element Number in FIG. 11 | Gate material | Gate dielectric material |
|---|---|---|
| 370 | TiSiN | $SiO_2$ |
| 372 | TiN | $SiO_2$ |
| 374 | TiSiN | $HfSiO_x$ |
| 376 | TiN | $HfO_x$ |
| 378 | TiN | $HfSiO_x$ |
| 380 | TiSiN | $HfO_x$ |

Figure 12:
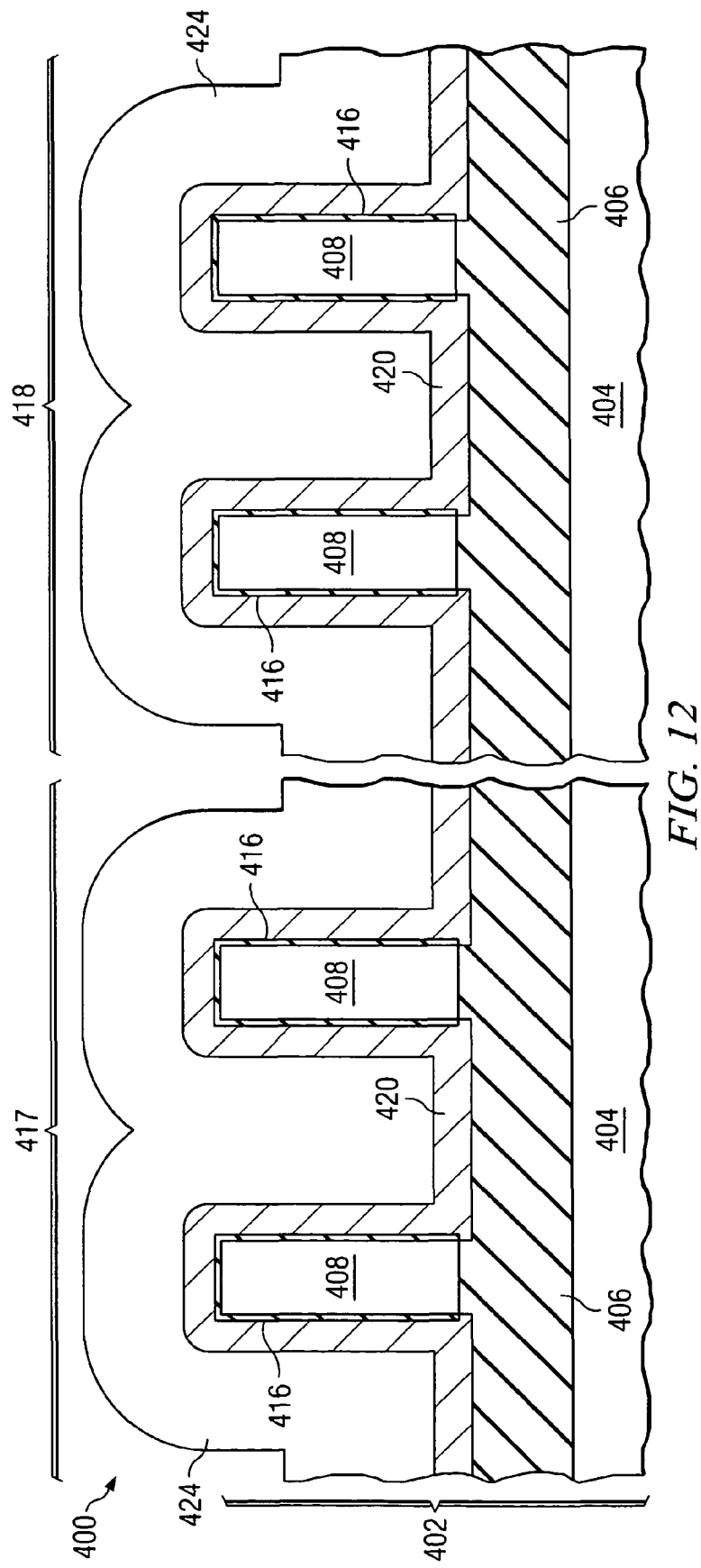
FIG. 12 shows a cross-sectional view of an embodiment of the present invention implemented in a tri-gate transistor device.

FIG. 12 shows a cross-sectional view of an embodiment of the present invention implemented in a tri-gate transistor device. In this embodiment, a hard mask is not used over the top surface of the second layer of semiconductor material 408 of the SOI substrate 402, or alternatively, the hard mask is removed after the second layer of semiconductor material 408 is patterned to form the fin structures 408. In this embodiment, each transistor includes three first gate electrodes on a fin structure 408. A first gate electrode is disposed on a first sidewall of the fin structures 408, and a second gate electrode is disposed on a second sidewall of the fin structures 408, wherein the second sidewall opposes the first sidewall of the same fin structure 408. A third gate electrode is disposed on a top surface of each fin structure 408. The fin structures 408 function as channels of the transistors in the first region 417 and the second region 418, for example. The gate electrodes 420 may have work functions that are tuned by the gate electrode thickness, as described with reference to FIGS. 1 through 5, and FIGS. 6 and 7, or alternatively, the gate electrodes 420 may have work functions that are tuned by implanting dopant species into either the first region 417, the second region 418, or both into the first region 417 and the second region 418 at different doping levels, for example.

Processing of the semiconductor device is then continued, as shown in FIG. 13, which shows a semiconductor device 300 comprising a multiple gate FinFET device in accordance with embodiments of the present invention, after the formation of upper metallization and insulating layers over the FinFET device. FIG. 14 shows a fin structure of the FinFET device shown in FIG. 13 in a view perpendicular to the view shown in FIG. 13.

Portions of the fin structures 308 may be implanted with dopants to form source region 308b and drain region 308c, as shown in FIG. 14. A view of the channel 308a disposed between the source region 308b and the drain region 308c can also be seen in the view shown in FIG. 14, for example. The implantation steps to form the source and drain regions 308b and 308c may alternatively take place before the manufacturing process steps described herein, in some embodiments, for example. Spacers 394 comprising an insulating material such as an oxide, nitride, or combinations thereof, may be formed over the sidewalls of the gate electrodes 324/320 and hard mask 310/312/314, also shown in FIG. 14. Insulating and conductive layers may be formed over the CMOS FinFET or tri-gate transistors, such as insulating layers 384 and 390.

Contact 386a (FIG. 13) provides electrical contact to the gate of the multiple gate device, e.g., making contact with a silicide material 382 that is formed over the semiconductor material 324. Likewise, contact 386b (FIG. 14) provides electrical contact to the source 308b via silicide 382 formed over the source 308b, and contact 386c provides electrical contact to the drain 308c via silicide 382 formed over the drain 308c.

Additional metallization and insulating layers may be formed and patterned over the top surface of the insulating material and contacts, such as conductive lines 388a, 388b, and 388c that make electrical contact to the contacts 386a, 386b, and 386c. Bond pads (not shown) may be formed over contacts, and a plurality of the semiconductor devices 300 may then be singulated or separated into individual die. The bond pads may be connected to leads of an integrated circuit package (also not shown) or other die, for example, in order to provide electrical contact to the multiple gate transistors of the semiconductor device 300.

The multiple gate transistors preferably comprise a PMOS transistor in the first region 317 and an NMOS transistor in the second region 318, in one embodiment. The gate electrode material 320 is preferably thicker in the PMOS transistor than in the NMOS transistor, or the gate electrode material 320 preferably comprises a higher dopant concentration in the NMOS transistor than in the PMOS transistor, in accordance with embodiments of the present invention. The thickness of the gate electrode material 320, or the dopant level of the gate electrode material 320, causes the gate material of the PMOS transistor to have a work function of about 4.85 eV, in one embodiment, and causes the gate material of the NMOS transistor to have a work function of about 4.45 eV, in one embodiment. In other embodiments, the work function of the PMOS transistor gate electrode preferably comprises about 4.5 to 4.9 eV, and the work function of the PMOS transistor gate electrode preferably comprises about 4.2 to 4.6 eV, for example. The transistors 120 and 122 preferably have substantially symmetric threshold voltages of about +0.3 and −0.3 V, respectively, as examples, in one embodiment, although the threshold voltages may alternatively comprise other voltage levels, such symmetric $V_t$ values of about ±0.1 V to about 15 V, as examples.

Embodiments of the present invention achieve technical advantages in several different multiple gate transistor device applications. For example, embodiments of the invention may be implemented in NMOS high performance (HP) devices, NMOS low operation power (LOP) devices, NMOS low standby power (LSTP) devices, PMOS high performance devices, PMOS low operation power devices, and PMOS low standby power devices, as examples. The parameters for these HP devices, LOP devices, and LSTP devices, are defined in the 2002 edition of International Technology Roadmap for Semiconductors (ITRS), which is incorporated herein by reference. Preferably, in accordance with some embodiments of the present invention, all devices of one type (e.g., either NMOS or PMOS) will have the same implantation doping levels, but may have different gate electrode layer thicknesses, according to the type of device, e.g., HP, LOP, or LSTP. Additional implantation processes are optional, but are not necessary, for example.

Figure 15:
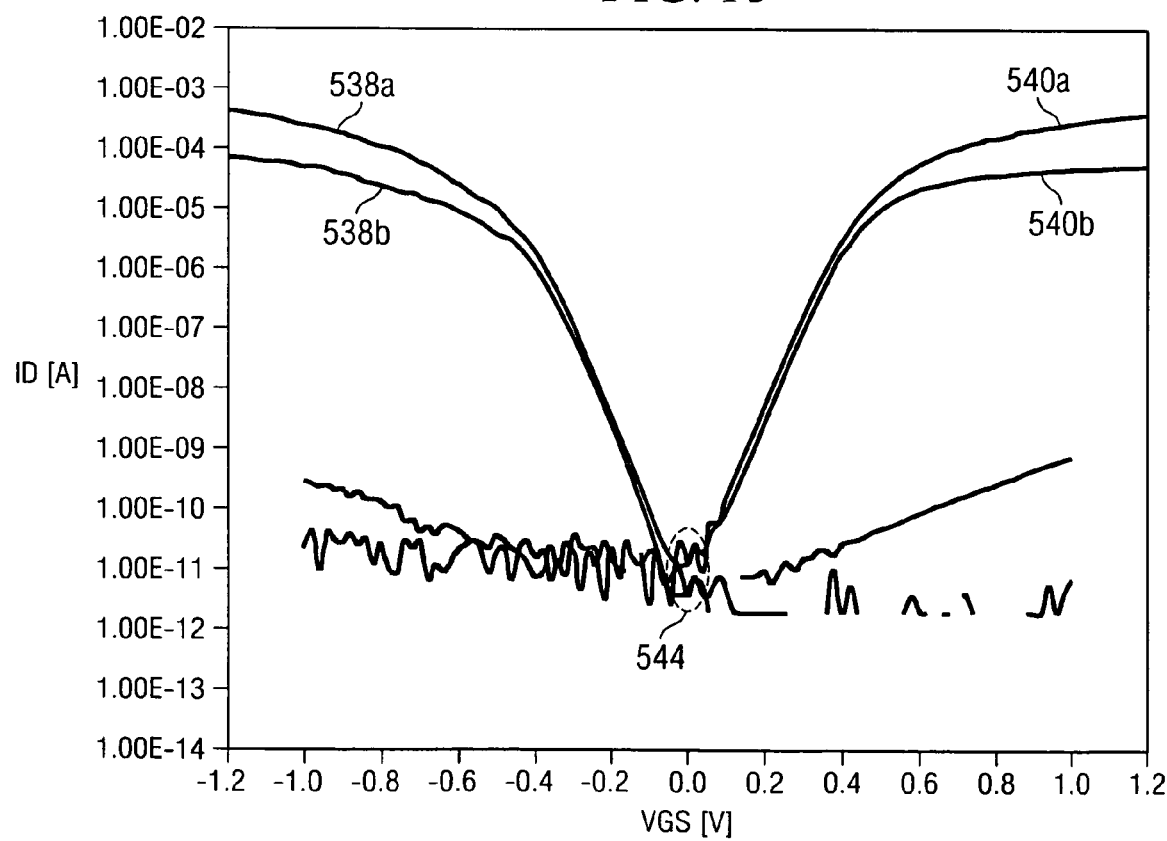
FIG. 15 shows measured transfer characteristics of a low standby power (LSTP) CMOS tri-gate device comprising a TiSiN gate material with Si implanted into the NMOS gate, in accordance with an embodiment of the present invention.
Figure 16:
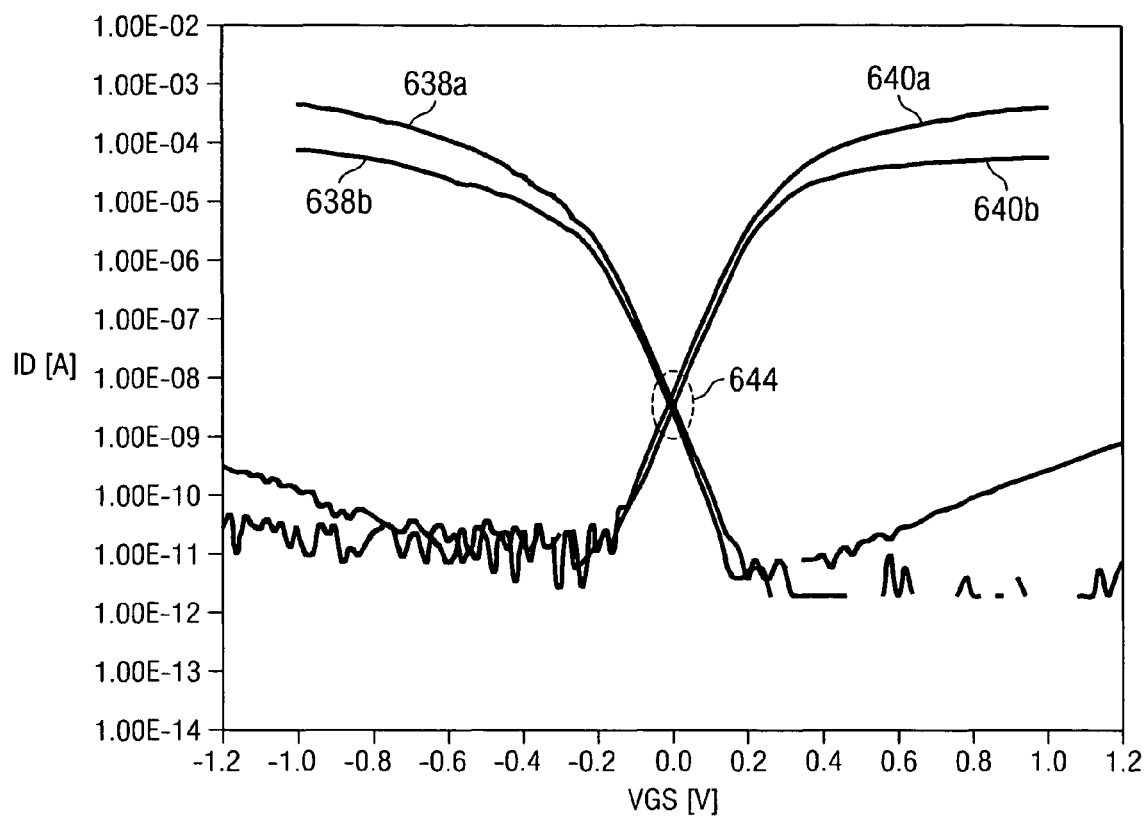
FIG. 16 shows estimated transfer characteristics of a high performance (HP) CMOS tri-gate device comprising a TiSiN gate material with Si implanted into the NMOS gate, in accordance with an embodiment of the present invention.
Figure 17:
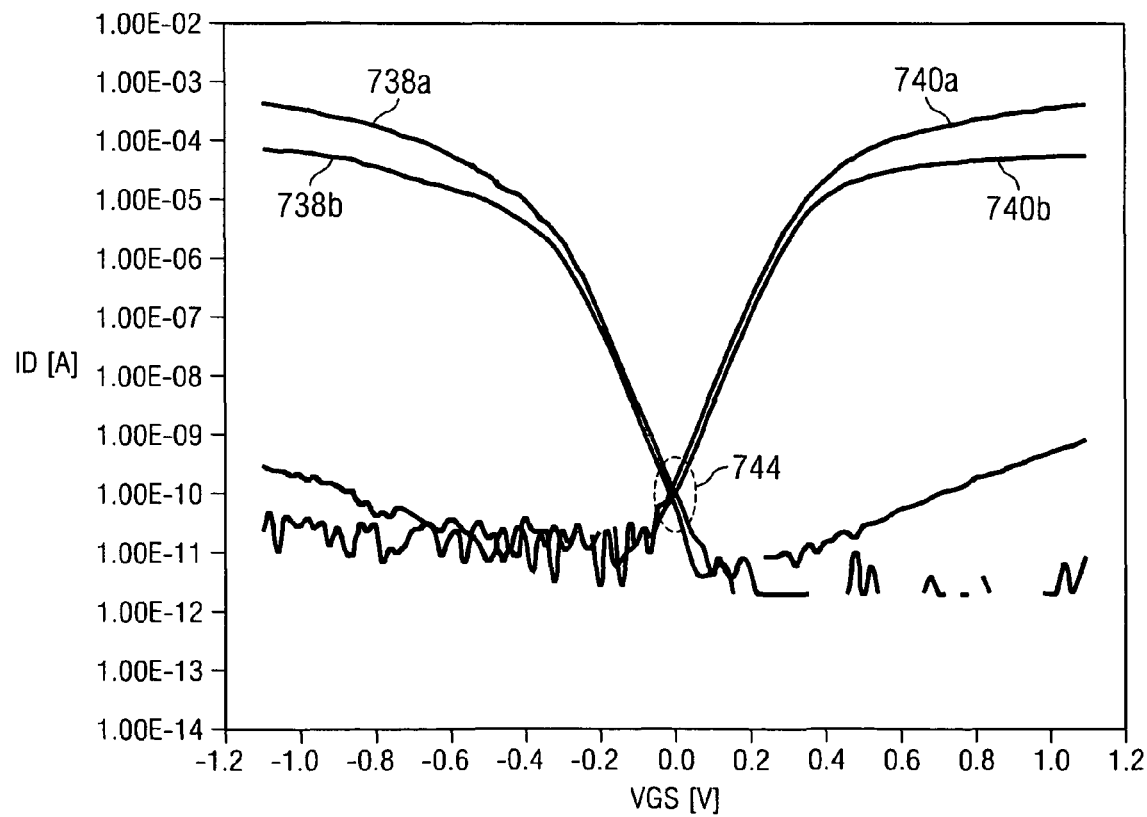
FIG. 17 shows estimated transfer characteristics of a low operating power (LOP) CMOS tri-gate device comprising a TiSiN gate material with Si implanted into the NMOS gate, in accordance with an embodiment of the present invention.

FIGS. 15 through 17 illustrate that the implantation dose can be varied to achieve a desired transfer characteristic, based on the type of device, e.g., low standby power, low operating power, or high performance. For example, FIG. 15 shows measured transfer characteristics of a low standby power CMOS tri-gate device comprising a TiSiN gate material having a thickness of about 100 Angstroms with Si implanted into the NMOS gate by an amount that is optimized for a low standby power device, in accordance with an embodiment of the present invention. The graph was calculated for a PMOS and NMOS tri-gate device with undoped channels and polysilicon as a gate material for two different drain to source voltages (VDS) each, for the PMOS and NMOS transistor. The curve at 538a shows the drain current (ID) for a range of gate to source voltage levels (VGS) at a drain voltage (Vd) of 1.2 V for the PMOS transistor, and the curve at 538b shows ID vs. VGS at a Vd of 0.05 V for the PMOS transistor. The curve at 540a shows ID vs. VGS at a Vd of 1.2 V for the NMOS transistor, and the curve at 540b shows ID vs. VGS at a Vd of 0.05 V for the NMOS transistor. The curves 538a and 540a, and 538b and 540b, cross at a VGS of 0 at a drain current ID of about 1.00E-11 in region 544, for example.

FIG. 16 shows estimated transfer characteristics of a high performance CMOS tri-gate device comprising a TiSiN gate material having a thickness of about 200 Angstroms for a PMOS device and a thickness of about 75 Angstroms for an NMOS device. The NMOS device gate material was implanted with Si at a concentration optimized for a high power device. The curve at 638a shows ID vs. VGS at a Vd of 1.2 V for the PMOS transistor, and the curve at 638b shows ID vs. VGS at a Vd of 0.05 V for the PMOS transistor. The curve at 640a shows ID vs. VGS at a Vd of 1.2 V for the NMOS transistor, and the curve at 640b shows ID vs. VGS at a Vd of 0.05 V for the NMOS transistor. The curves 638a and 640a, and 638b and 640b, cross at a VGS of 0 at a drain current ID between about 1.00E-8 to 1.00E-9 in region 644, for example.

FIG. 17 shows estimated transfer characteristics of a low operating power CMOS tri-gate device comprising a TiSiN gate material having a thickness of about 200 Angstroms for a PMOS device and a thickness of about 75 Angstroms for an NMOS device. The NMOS device gate material was implanted with Si at a concentration optimized for a low operating power device. The curve at 738a shows ID vs. VGS at a Vd of 1.2 V for the PMOS transistor, and the curve at 738b shows ID vs. VGS at a Vd of 0.05 V for the PMOS transistor. The curve at 740a shows ID vs. VGS at a Vd of 1.2 V for the NMOS transistor, and the curve at 740b shows ID vs. VGS at a Vd of 0.05 V for the NMOS transistor. The curves 738a and 740a, and 738b and 740b, cross at a VGS of 0 at a drain current ID at about 1.00E-10 in region 744, for example.

Thus, as shown in FIGS. 15-17 and as described herein, the doping implantation level and the thickness of the gate materials of a multiple gate CMOS device may be adjusted for the PMOS and NMOS transistors, to achieve the transfer characteristic and desired performance for a CMOS device, in accordance with embodiments of the present invention.

Novel semiconductor devices comprising CMOS multiple gate devices having PMOS and NMOS devices comprising a metal are formed in accordance with embodiments of the present invention. Advantages of preferred embodiments of the present invention include providing methods of fabricating semiconductor devices 100, 200, 300, and 400, and structures thereof. The multiple gate PMOS and NMOS transistors formed in the first regions 117, 217, 317, and 417 and the second region 118, 218, 318, and 418, respectively, preferably have a substantially symmetric $V_t$. For example, $V_{tp}$ may be about $-0.3$ V, and $V_{tn}$ may be the substantially the same positive value, e.g., about $+0.3$ V. The thickness of the metal gate layer and/or the dopant implantation level establish the work function of the gate electrode materials of the multiple gate PMOS and NMOS devices, for example. Either the gate material thickness, the dopant implant level of the gate material, or both, of the PMOS and NMOS transistors, may be used to adjust the work function of the PMOS and NMOS transistors, in accordance with embodiments of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a first transistor, the first transistor including at least two first gate electrodes, each first gate electrode adjacent a first gate dielectric, wherein each first gate electrode of the at least two first gate electrodes has a first thickness; and
a second transistor proximate the first transistor, the second transistor including at least two second gate electrodes, each second gate electrode adjacent a second gate dielectric, wherein each second gate electrode of the at least two second gate electrodes has a second thickness, the second thickness being different than the first thickness, wherein a material of the first gate electrode at an interface between the first gate electrode and the first gate dielectric is the same as a material of the second gate electrode at an interface between the second gate electrode and the second gate dielectric, wherein the at least two first gate electrodes and the at least two second gate electrodes each comprise a first metallic layer and a second semiconductive layer disposed over the first metallic layer, and wherein a metallic layer of about a same thickness is disposed on the at least two first gate electrodes and the at least two second gate electrodes.

2. The semiconductor device according to claim 1, wherein the each first gate electrode comprises a first dopant level, and wherein the each second gate electrode comprises a second dopant level.

3. The semiconductor device according to claim 1, wherein the first thickness establishes a first work function of the first transistor, wherein the second thickness establishes a second work function of the second transistor, and wherein the second work function is different than the first work function.

4. The semiconductor device according to claim 3, wherein the first transistor comprises a PMOS transistor, wherein the second transistor comprises an NMOS transistor, wherein the first work function comprises about 4.5 to 4.9 eV, and wherein the second work function comprises about 4.2 to 4.6 eV.

5. The semiconductor device according to claim 1, wherein the first transistor comprises at least one first fin structure, wherein the at least two first gate electrodes are disposed on a first sidewall of the at least one first fin structure and a second sidewall of the at least one first fin structure opposing the first sidewall of the at least one first fin structure, wherein the at least one first fin structure comprises a channel of the first transistor, wherein the second transistor comprises at least one second fin structure, wherein the at least two second gate electrodes are disposed on a first sidewall of the at least one second fin structure and a second sidewall of the at least one second fin structure opposing the first sidewall of the at least one second fin structure, wherein the at least one second fin structure comprises a channel of the second transistor.

6. The semiconductor device according to claim 5, wherein the first transistor includes three first gate electrodes, one of the three first gate electrodes being disposed on a top surface of the at least one first fin structure, and wherein the second transistor includes three second gate electrodes, one of the three second gate electrodes being disposed on a top surface of the at least one second fin structure.

7. The semiconductor device according to claim 5, further comprising:
a gate dielectric disposed between at least the first and second sidewalls of the at least one first fin structure and the at least two first gate electrodes, and disposed between at least the first and second sidewalls of the at least one second fin structure and the at least two second gate electrodes, wherein the gate dielectric comprises a hafnium-based dielectric, $HfO_2$, $HfSiO_x$, $Al_2O_3$, $ZrO_2$, $ZrSiO_x$, $Ta_2O_5$, $La_2O_3$, nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$.

8. The semiconductor device according to claim 1, further comprising a plurality of the first transistors and a plurality of the second transistors, wherein each first transistor and each second transistor comprise a PMOS transistor and an NMOS transistor, respectively, of a CMOS device, wherein a first CMOS device comprises a first device type, wherein a second CMOS device comprises a second device type, wherein the second device type is different from the first device type, and wherein the first device type and the second device type comprise a high performance (HP) device, a low operation power (LOP) device, or a low standby power (LSTP) device.

9. The semiconductor device of claim 1, wherein one of the at least two first gate electrodes is disposed on a top surface of a first fin structure, wherein one of the at least two second gate electrodes is disposed on a top surface of a second fin structure.

10. The semiconductor device according to claim 1, wherein the at least two first gate electrodes comprise a first layer, a second layer disposed over the first layer, and a third layer disposed over the first layer, the third layer comprising a semiconductor material, and wherein the at least two second gate electrodes comprise the first layer and the third layer, the third layer physically contacting and disposed over the first layer.

11. The semiconductor device according to claim 1, wherein the metallic layer is a silicide layer.

12. A semiconductor device, comprising:
a first transistor, the first transistor including at least two first gate electrodes, each first gate electrode having a first thickness, a top portion and a lower portion contacting a first dielectric, wherein the at least two first gate electrodes comprise a first layer, a second layer disposed over the first layer, and a third layer disposed over the first layer, the third layer comprising a semiconductor material; and
a second transistor proximate the first transistor, the second transistor including at least two second gate electrodes, each second gate electrode having a second thickness, a top portion and a lower portion contacting a second dielectric, the second thickness being different than the first thickness, wherein the at least two second gate electrodes comprise the first layer and the third layer, the third layer physically contacting and disposed over the first layer, wherein the first thickness establishes a first work function of the at least two first gate electrodes, wherein the second thickness establishes a second work function of the at least two second gate electrodes, wherein the second work function is different than the first work function, and wherein a material of the lower portion of the at least two first gate electrodes is the same as a material of the lower portion of the at least two second gate electrodes.

13. The semiconductor device according to claim 12, wherein the lower portion of the at least two first gate electrodes and the at least two second gate electrodes comprise TiSiN.

14. The semiconductor device according to claim 12, wherein the at least two first gate electrodes and the at least two second gate electrodes comprise TiSiN, TiN, TaN, Ta, Ru, HfN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, partially silicided materials thereof, fully silicided materials thereof, and/or combinations thereof.

15. The semiconductor device according to claim 12, wherein the semiconductor device comprises a complementary metal oxide semiconductor (CMOS) device, wherein the first transistor comprises a PMOS transistor, wherein the second transistor comprises an NMOS transistor, and wherein the first thickness is greater than the second thickness.

16. The semiconductor device according to claim 15, wherein the first thickness is greater than the second thickness by about 50 Angstroms or more.

17. The semiconductor device according to claim 15, wherein the first thickness comprises about 500 Angstroms or less, and wherein the second thickness comprises about 100 Angstroms or less.

18. The semiconductor device according to claim 12, wherein the first layer and the second layer comprise a metal.

19. The semiconductor device according to claim 1, wherein the material of the first gate electrode at an interface between the first gate electrode and the first gate dielectric comprises TiSiN.

20. The semiconductor device according to claim 12, further comprising a silicide layer disposed on the third layer over the at least two first gate electrodes and on the third layer over the at least two second gate electrodes, the silicide layer over the at least two first gate electrodes and the at least two second gate electrodes having about a same thickness.

* * * * *